United States Patent [19]
Fujishima et al.

[11] Patent Number: 5,523,599
[45] Date of Patent: Jun. 4, 1996

[54] HIGH VOLTAGE MIS FIELD EFFECT TRANSISTOR

[75] Inventors: Naoto Fujishima; Akio Kitamura, both of Kanagawa, Japan

[73] Assignee: Fuji Electric Co., Ltd., Kanagawa, Japan

[21] Appl. No.: 195,453

[22] Filed: Feb. 14, 1994

[30] Foreign Application Priority Data

Feb. 15, 1993 [JP] Japan ................... 5-025109

[51] Int. Cl.$^6$ ............................................. H01L 29/76
[52] U.S. Cl. ................... 257/327; 257/335; 257/343; 257/401; 257/653
[58] Field of Search ......................... 257/327, 335, 257/339, 343, 367, 401, 630, 653

[56] References Cited

U.S. PATENT DOCUMENTS 5,055,896  10/1991  Williams et al. .................. 357/23.8

FOREIGN PATENT DOCUMENTS

| | | |
|---|---|---|
| 0337823A2 | 10/1989 | European Pat. Off. . |
| 3816002A1 | 12/1988 | Germany . |
| 56-38867 | 4/1981 | Japan . |
| 57-12558 | 1/1982 | Japan . |
| 58-80869 | 5/1983 | Japan . |
| 62-242365 | 10/1987 | Japan . |
| 1-207976 | 8/1989 | Japan . |

OTHER PUBLICATIONS

E. J. Wildi et al., "Modeling and Process Implementation of Implanted Resurf Type Devices," Technical Digest of the International Electron Devices Meeting 1982, San Franciso, CA, Dec. 13–15, pp. 268–271.

Fujishima et al., "Low On–Resistance High–Voltage Power DMOSfet with an Interdigitated Form," 1993 International Conference on Solid State Devices and Materials, Makuhari Messe Aug. 29–Sep. 1, pp. 491–493.

M. Amato, "Reduced Electric Field Crowding at the Fingertips of Lateral Dmos Transistors," Extended Abstracts, Spring 1987, No. 1, pp. 161–162.

*Primary Examiner*—Mark V. Prenty
*Attorney, Agent, or Firm*—Finnegan, Henderson, Farabow, Garrett & Dunner

[57] ABSTRACT

A high voltage MIS field effect transistor includes a semiconductor substrate of a first conductivity type; a semiconductor layer of a second conductivity type formed on an obverse surface side of the semiconductor substrate; a base layer of the first conductivity type formed in the semiconductor layer; a source layer of the second conductivity type formed in the base layer; a source electrode abutting the source layer; a gate electrode formed in such a manner as to extend from the source layer to the semiconductor layer via an insulating gate film; a drain section including a drain layer of the second conductivity type formed in the semiconductor layer in such a manner as to be spaced apart from the source layer; and a low-concentration region of the first conductivity type being formed in a vicinity of a periphery of a base corner portion of said base layer. Another low-concentration region of the second conductivity type is further formed in a vicinity of a periphery of a drain corner portion of the base layer.

21 Claims, 17 Drawing Sheets

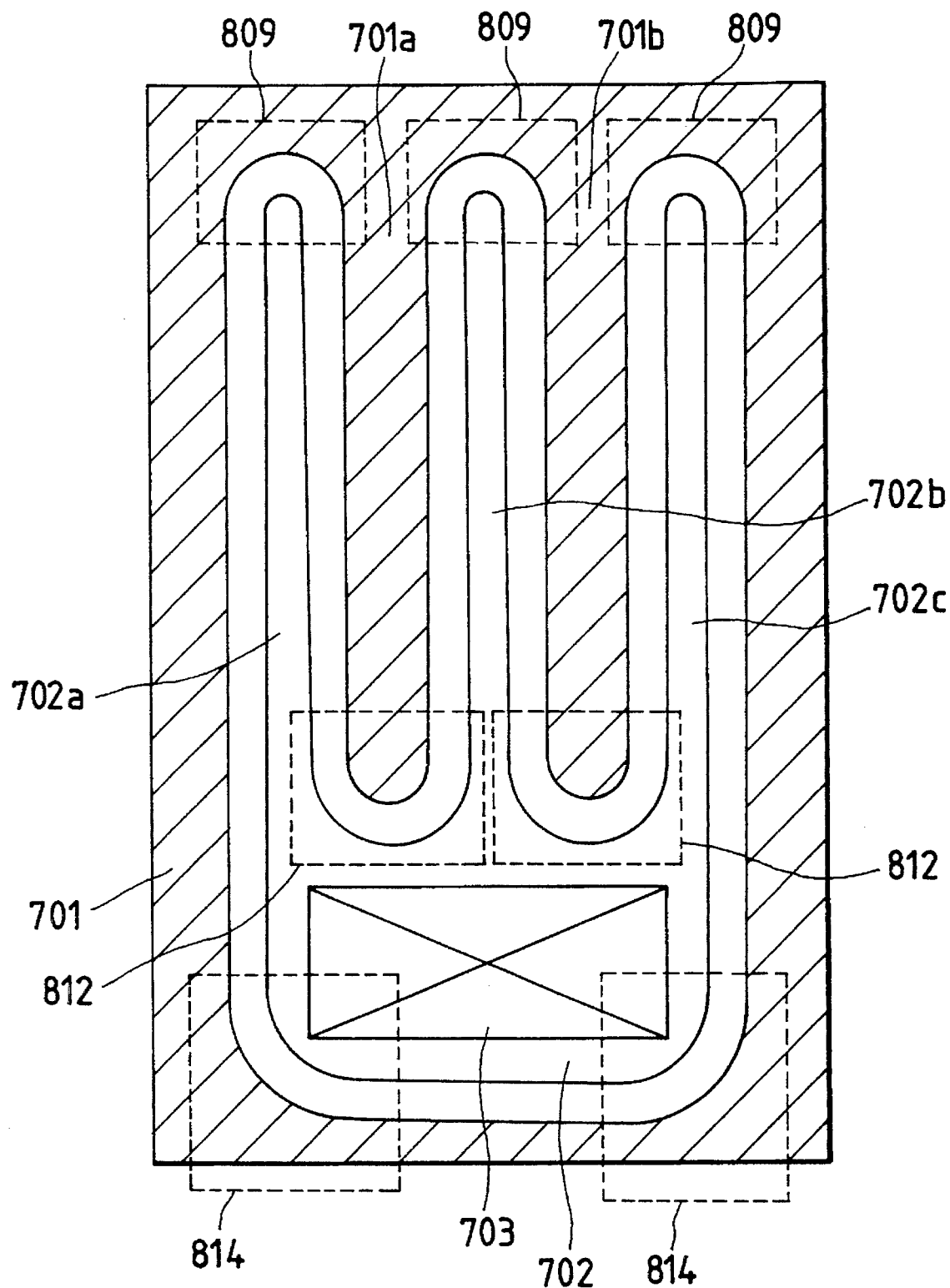
FIG. 18 PROIR ART

HIGH VOLTAGE MIS FIELD EFFECT TRANSISTOR

BACKGROUND OF THE INVENTION

The present invention relates to a configuration of an MIS (Metal Insulator Semiconductor) field effect transistor, and particularly to a high voltage MIS field effect transistor having a high withstanding voltage. More particularly, the present invention relates to a technique for integrating a high voltage MIS field effect transistor with a control circuit section to a high density.

Conventionally, a planar cell structure shown in FIG. 17 has been adopted to integrate a high voltage MIS field effect transistor. The high voltage MIS field effect transistor shown in FIG. 17 is an n-channel-type MOSFET, in which drain regions 702, which are output terminal regions, are juxtaposed in parallel on an n-type semiconductor layer. The drain regions 702 are surrounded by an input terminal region 701 constituted by a source layer, gate electrodes, and the like. A drain pad opening portion 703 is formed at each of both ends of the drain region 702, and a wire is conductively connected to the drain pad opening portion 703 to control the MOSFET. With the MOSFET of the above-described configuration, however, it is necessary to secure a distance between adjacent ones of the drain regions 702 by not less than the width of the drain pad opening portion 703, so that limits exist for attaining high integration and low on-resistance of the device. Therefore, to achieve a higher degree of integration and permit low on-resistance, the input terminal region 701 and the output terminal region (drain region) 702 are formed in an interdigitated shape, an example of which is shown in FIG. 18. In the high voltage MOSFET, three drain regions 702a to 702c extend so as to branch off from the drain region 702 where the drain pad opening portion 703 is formed, and input terminal regions 701a and 701b are respectively formed between adjacent ones of these drain regions 702a to 702c. With the high voltage MOSFET having the above-described configuration, it is unnecessary to form drain pads in the respective comb-teeth-shaped drain regions 702a to 702c, making it possible to form the drain regions 702a to 702c with a narrow pitch. Since the enlargement of the channel width can be attained, it is possible to attain the high integration with a large current capacity and low on-resistance of the device.

With respect to such a technique of integrating a high voltage device, a further description will be given by referring to FIGS. 19(a) and 19(b). FIG. 19(a) is a plan view of a highly integrated MOSFET in which the input terminal region and the output terminal region are formed in an interdigitated shape in the same way as the high voltage MOSFET shown in FIG. 18 and FIG. 19(b) is a cross-sectional view thereof. This highly integrated, high voltage MOSFET is a horizontal type MOSFET manufactured by using a double diffusion method, and is called a horizontal-type DMOS. Referring first to the cross-sectional view shown in FIG. 19(b), a description will be given of this horizontal-type DMOS. In an n-type well layer 902 diffusion-formed on the obverse surface side of a p-type semiconductor substrate 901, a MOS section 925 is formed at one end thereof, while a drain section 926 is formed on another end thereof. In the MOS section 925, p-type base layers 903 constituting channel-forming layers are formed at both ends of a gate electrode 909. An n⁺-type source layer 906 and a p⁺-type base contact layer 905 are respectively formed in each of these base layers 903. The gate electrode 909 is formed in such a manner as to extend between the pair of source layers 906 via a gate oxide film 907 and over the base layers 903 and the well layer 902. A source electrode 910 abuts the source layer 906 and the base contact layer 905. The source electrode 910 has a field plate portion 910a which extends over an insulating film 915 toward a drain layer 908 which will be described later. Thus, the MOS section 925 has a structure in which the source layer 906 and the base layer 903 are double-diffused. In addition, the field plate portion 910a alleviates the concentration of an electric field at an end of the source layer 906, and a high voltage withstanding structure is thereby formed.

In the drain section 926, which is formed on the other end side of the well layer 902, the n⁺-type drain layer 908 is formed on the surface of the well layer 902, and a drain electrode 911 abuts this drain layer 908. On the MOS section 925 side, this drain electrode 911 has a field plate portion 911a which projects over the insulating film 915 in a manner similar to that of the source electrode 910. Accordingly, the concentration of the electric field at the source layer 906 side end of the drain layer 908 is alleviated, and a high voltage withstanding structure is thereby formed.

Furthermore, in the horizontal-type DMOS, a p-type offset layer 904 is formed on the surface of the well layer 902 in such a manner as to extend between the base layer 903 and the drain layer 908, and the thick insulating film 915 is formed on this offset layer 904.

In such a horizontal-type DMOS, if a positive potential is applied to the gate electrode 909, the surface of the base layer 903 immediately below the gate electrode 909 becomes an n-type inverted layer, so that electrons, which are carriers, begin to flow from the source layer 906 to the well layer 902 via that inverted layer. These electrons flow downwardly on the lower side of the gate electrode 909, then flow in the horizontal direction along the well layer 902, and reach the drain layer 908 so as to be absorbed.

As shown in FIG. 19(a), the planar structure of the horizontal-type DMOS having the above-described construction is arranged such that a MOSFET section (the region indicated by T in the drawing), which is comprised of the MOS section 925, the source layer 906, and the drain section 926, is juxtaposed in parallel in the region of the well layer 902 formed on the semiconductor substrate 901 in the shape of a comb tooth. By repeating this comb tooth portion, the on-resistance of the device can be reduced, and the MOSFET section having a targeted on-resistance can be integrated in the same chip. The structure adopted is such that the concentration of an electric field caused by the wiring of a high-voltage wire is alleviated by adopting aerial wiring by providing a pad on each drain pad opening portion 914 and performing wire bonding with respect to the same.

In recent years, active development has been made of power integrated circuits (ICs) in which a power MOSFET capable of withstanding several hundred voltages or more and having a high-current output of several amperes and a control circuit section operating at a low voltage of about 5 V are incorporated in a single chip. As ICs for switching power sources, there are some which have already been realized. However, in order to realize such power ICs at low cost, a reduction in the chip size is essential. Accordingly, it is important to minimize the power MOSFET section which occupies a large area in the power IC.

Here, in the conventional horizontal-type DMOS described above with reference to FIGS. 19(a) and 19(b), in order to enhance the degree of integration of the device and reduce the on-resistance per unit area, it is necessary to reduce the width V of the drain layer 908 and the width U of the base layer 903 around the gate electrode 909. However, because of decreases in the radius of curvature due to reductions in the width V of the drain layer 908 and the width U of the base layer 903, the electric field is concentrated sharply in a drain corner portion 912 and in a base corner portion 913. The drain corner portion has a protruding shape in a plan view and located at a tip (terminating end) of the drain layer 908 extending toward the region of the MOS section 925. The base corner portion 913 has a protruding shape in a plan view and located at a tip (terminating end) of the base layer 903 projecting in correspondence to a recessed region, in a plan view, of the drain section 926. Consequently, there are problems in that the withstand voltage drops and the withstand voltage characteristic of the device deteriorates. Regarding the drop in withstand voltage, it has been confirmed by tests that in a case where the radius of curvature of the drain corner portion 912 and the base corner portion 913 is sufficiently large, a withstand voltage of 600 to 800 V is obtained, whereas if the radius of curvature is reduced to 5 to 30 μm, the withstand voltage drops substantially to 100 to 300 V. In addition, in the high voltage MOSFET shown in FIG. 18, the concentration of the electric field also occurs at ends (protruding drain corner portions in a plan view) 812 of the input terminal regions 701a and 701b and at ends (protruding drain corner portions in a plan view) 809 of the output terminal regions 702a to 702c. Furthermore, it is necessary to take into account the concentration of the electric field at outer peripheral ends 814 of the drain pad 703, to which a strong electric field is applied. Also, there has been a possibility that the withstand voltage is rate-determined by these portions.

SUMMARY OF THE INVENTION

Accordingly, in view of the above-described problems, it is an object of the present invention to realize a high voltage MIS field effect transistor capable of attaining a reduction of the on-resistance by a high degree of integration while securing a sufficient withstand voltage of the device.

According to the present invention, the above-described problems are overcome in that a low-concentration, high-resistance region is provided in the vicinity of a periphery of a base corner portion or a drain corner portion in which an electric field concentrates as a result of formation of an element into a finer pattern, thereby alleviating the concentration of the electric field in the base corner portion or the drain corner portion and enabling high integration without deteriorating the withstand voltage of the element.

Namely, as a high-voltage withstanding structure including the base corner portion, there is provided a high voltage MIS field effect transistor comprising: a semiconductor layer of a second conductivity type formed on an obverse surface side of a semiconductor substrate of a first conductivity type; a base layer of the first conductivity type formed in the semiconductor layer; a source electrode abutting a source layer of the second conductivity type formed in the base layer; a gate electrode formed in such a manner as to extend from the source layer to the semiconductor layer via an insulating gate film; and a drain section including a drain layer of the second conductivity type formed in the semiconductor layer in such a manner as to be spaced apart from the source layer, wherein a low-concentration region of the first conductivity type is formed in a vicinity of a periphery of a base corner portion of the base layer, the base corner portion exhibiting a protruding shape in a plan view.

In such a basic high voltage withstanding structure including the base corner portion, an offset layer of the first conductivity type is formed in such a manner as to extend between the base layer and the drain layer.

In addition, the low-concentration region of the first conductivity type may be a partial region of the semiconductor substrate selectively left intact as a region where the semiconductor layer is not formed, or may be a diffused layer formed from an obverse surface side of the semiconductor layer to the semiconductor substrate. In such a configuration, a side end, in a depthwise direction, of a portion where the semiconductor layer of the second conductivity type is not formed may terminate at a bottom of the base layer, or the side end, in the depthwise direction, of the portion where the semiconductor layer of the second conductivity type is not formed may terminate on a lower side of the gate electrode. Furthermore, the side end, in the depthwise direction, of the portion where the semiconductor layer of the second conductivity type is not formed may surround the base layer.

Alternatively, as a high-voltage withstanding structure including the drain corner portion, there is provided a high voltage MIS field-effect transistor including a semiconductor-layer of a second conductivity type formed on an obverse surface side of a semiconductor substrate of a first conductivity type and a base layer of the first conductivity type formed in the semiconductor layer. A source electrode abuts a source layer of the second conductivity type formed in the base layer and a gate electrode is formed in such a manner as to extend from the source layer to the semiconductor layer via an insulating gate film. A drain section includes a drain layer of the second conductivity type formed in the semiconductor layer in such a manner as to be spaced apart from the source layer; and an offset layer of the first conductivity type is formed on an obverse surface side of the semiconductor layer. A low-concentration region of the second conductivity type is formed in a vicinity of a periphery of a drain corner portion of the drain layer, and the drain corner portion exhibits a protruding shape in a plan view.

In such a basic high voltage withstanding structure including the drain corner portion, the low-concentration region of the second conductivity type may be a partial region of the semiconductor layer of the second conductivity type selectively left intact as a region where the offset layer is not formed. In such a configuration, the side end, in the depthwise direction, of the portion where the semiconductor layer of the second conductivity type is not formed may surround the base layer, or the side end, in the depthwise direction, of the portion where the semiconductor layer of the second conductivity type is not formed may terminate at a bottom of the base layer. Furthermore, the side end, in the depthwise direction, of the portion where the semiconductor layer of the second conductivity type is not formed may terminate at a bottom of the offset layer.

In the present invention, the above-described high voltage withstanding structure may be adopted for all the base corner portions and drain corner portions. In such a case, as a layout of one element, it is preferable to adopt a planar construction in which the drain section has its periphery surrounded by the gate electrode and the source electrode. Furthermore, it is possible to adopt a multiple-element planar construction comprising in a single chip a plurality of element layouts each based on the above-described element layout.

According to a feature of the present invention for attaining higher integration, there is provided a high voltage MIS field-effect transistor including a semiconductor layer of a second conductivity type formed on an obverse surface side of a semiconductor substrate of a first conductivity type and a base layer of the first conductivity type formed in the semiconductor layer. A source electrode abuts a source layer of the second conductivity type formed in the base layer. The transistor also includes a gate electrode formed in such a manner as to extend from the source layer to the semiconductor layer via an insulating gate film and a drain section including a drain layer of the second conductivity type formed in the semiconductor layer. The drain section includes a plurality of parallel regions and has its periphery surrounded by the gate electrode and the source electrode. A drain pad opening portion in a first parallel region is formed by being offset outwardly in a lengthwise direction parallel to a drain pad opening portion in a second parallel region adjacent to the first parallel region, and a width of a portion where the drain pad opening portion is not formed in the first parallel region is set to be smaller than a width of the drain pad opening portion. In such a configuration, the width of a portion where the drain pad opening portion is not formed in the second parallel region may be set to be smaller than the width of the drain pad opening portion. Additionally, the radius of curvature of the drain pad opening portion may preferably have a withstand voltage securing length which makes it possible to secure a predetermined withstand voltage. Furthermore, it is possible to adopt a configuration in which two or more of any of the plurality of parallel regions are connected. In the above-described high voltage withstanding structure including the base corner portion and the drain corner portion and the planar structure for high integration, the source electrode may be formed as a field plate-type source electrode, and the drain electrode may be formed as a field plate-type drain electrode.

According to one aspect of the above-described high voltage withstanding structure involving the base corner portion, the vicinity of the periphery of the base corner portion is formed as a low-concentration region of the first conductivity type. Since this low-concentration region is formed in the semiconductor layer of the second conductivity type, when the potential applied to the MIS section reaches a predetermined value, the low-concentration region is depleted by a depletion layer extending from the semiconductor layer toward the low-concentration region. Hence, a current path from the MIS section to the drain section is interrupted. At this time, since the impurity concentration in the low-concentration region is set at a low level, the low-concentration region can be depleted at an applied voltage which is sufficiently smaller than a critical voltage at which the base corner portion undergoes a breakdown. Therefore, even if the potential applied to the MIS section increases, the field strength applied to the base corner portion does not increase further than that voltage (depleting voltage). Thus, the withstand voltage of the element does not deteriorate even if an attempt is made to improve the degree of integration by reducing the radius of curvature of the base corner portion. Consequently, it is possible to attain high integration and low on-resistance while maintaining a targeted withstand voltage.

Advantageously, in a case where the offset layer is formed on the obverse surface side of the semiconductor substrate, it is possible to suppress the occurrence of hot electrons in a current path from the MIS section to the drain section, such as at an end of the drain layer which is subjected to a strong electric field, so that reliability can be improved. It is effective if the low-concentration region provided in the vicinity of the periphery of the base corner portion is a partial region of the semiconductor substrate selectively left intact as a region where the semiconductor layer of the second conductivity type is not formed. Further, where an epitaxial layer of the second conductivity type is formed on the semiconductor substrate by means of epitaxial growth, the low-concentration region can be secured by a diffused layer formed from an obverse surface side of this epitaxial layer to the semiconductor substrate, and can be formed in the same process as that for an element separating layer for separating elements.

According to another aspect of the invention employing the high voltage withstanding structure involving the drain corner portion, the vicinity of a periphery of the drain corner portion is made the low-concentration region of the second conductivity type. Since the offset layer of the first conductivity type is formed around this low-concentration region, when the voltage applied to the drain portion reaches a predetermined value, the low-concentration region is depleted by a depletion layer which extends from the offset layer toward the low-concentration region. Advantageously, in the same way as for the above-described electric-field-alleviating structure involving the base corner portion, because the depletion layer surrounds the drain corner portion, it can suppress an increase in the field strength with respect to the drain corner portion. Hence, it is possible to increase the degree of integration without impairing the withstand voltage. For this reason, since a reduction in the on-resistance due to high integration is attained, it is possible to increase the current capacity, and to structure a compact, high-performance semiconductor integrated circuit and a power IC.

Advantageously, in a case where the drain section has its periphery surrounded by the gate electrode and the source electrode, and the low-concentration semiconductor region of the first conductivity type and the low-concentration semiconductor region of the second conductivity type are formed for all the base corner portions and the drain corner portions, it is possible to alleviate the concentration of the electric field at a side end of an output terminal region. Hence, it becomes unnecessary to alleviate the concentration of the electric field by other means, and the element design is made easy.

According to feature of the planar construction of the element in accordance with the present invention, the drain pad opening portion in the first parallel region is formed by being offset outwardly in the lengthwise direction with respect to the drain pad opening portion in the second parallel region adjacent to the first parallel region, and the width of a portion where the drain pad opening portion is not formed in the first parallel region is set to be smaller than the width of the drain pad opening portion. Accordingly, it becomes possible to reduce the distance between adjacent parallel regions while securing a substantial distance between drain pad opening portions, which is considered necessary for securing a targeted withstand voltage. In addition, even in a case where the distance between the parallel regions is reduced, it is possible to secure the MIS section region provided between the parallel regions. Accordingly, it becomes possible to reduce the distance between the parallel regions without impairing the withstand voltage, and low on-resistance due to high integration can be attained. Furthermore, according to an implementation of this feature where the width of a portion, where the drain pad opening portion is not formed in the second parallel region, is set to be smaller than the width of the drain pad opening portion, it is possible to increase the channel width, facilitating low on-resistance.

BRIEF DESCRIPTION OF THE DRAWINGS

FIG. 18 is a plan view illustrating a configuration of a conventional high voltage MOSFET;

DETAILED DESCRIPTION OF THE PREFERRED EMBODIMENTS

Referring to the accompanying drawings, preferred embodiments of the present invention will be described hereafter.

First Embodiment

Figure 1A:
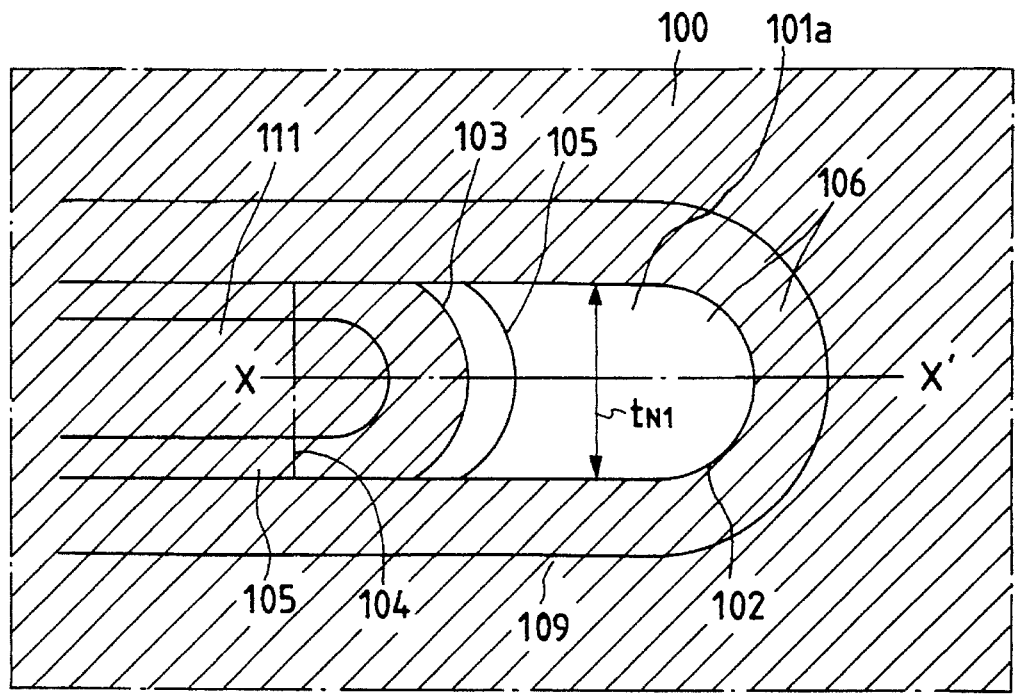
FIG. 1(a) is a plan view illustrating a configuration of a high voltage MOSFET in accordance with a first embodiment of the present invention.
Figure 1B:
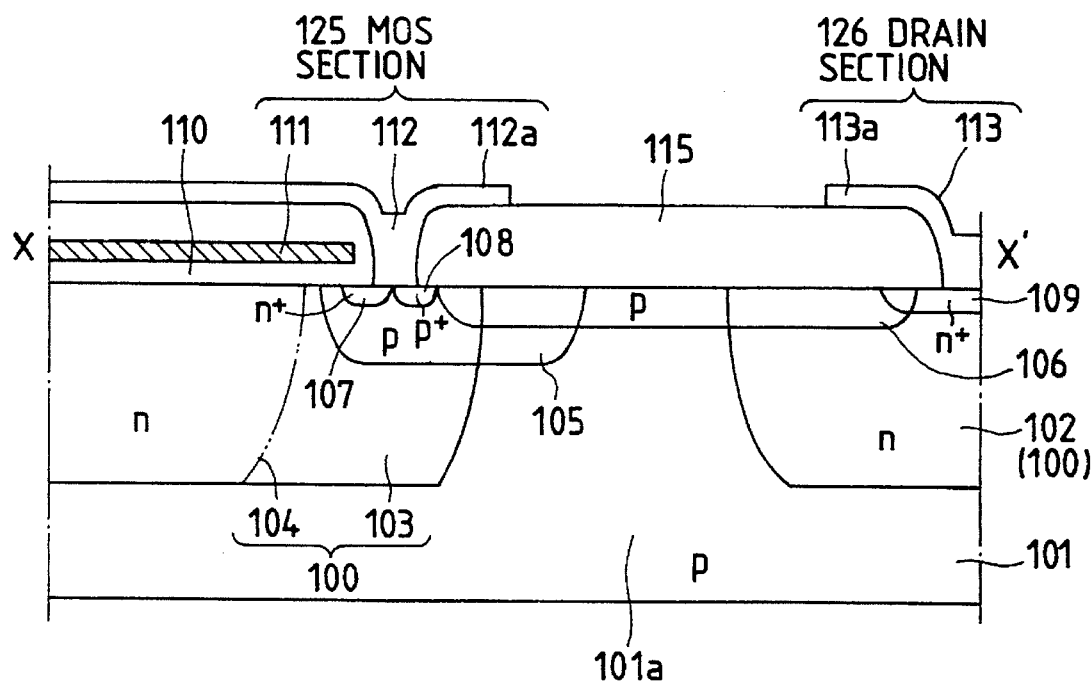
FIG. 1(b) is a cross-sectional view taken along line X—X' in FIG. 1(a)
Figure 19A:
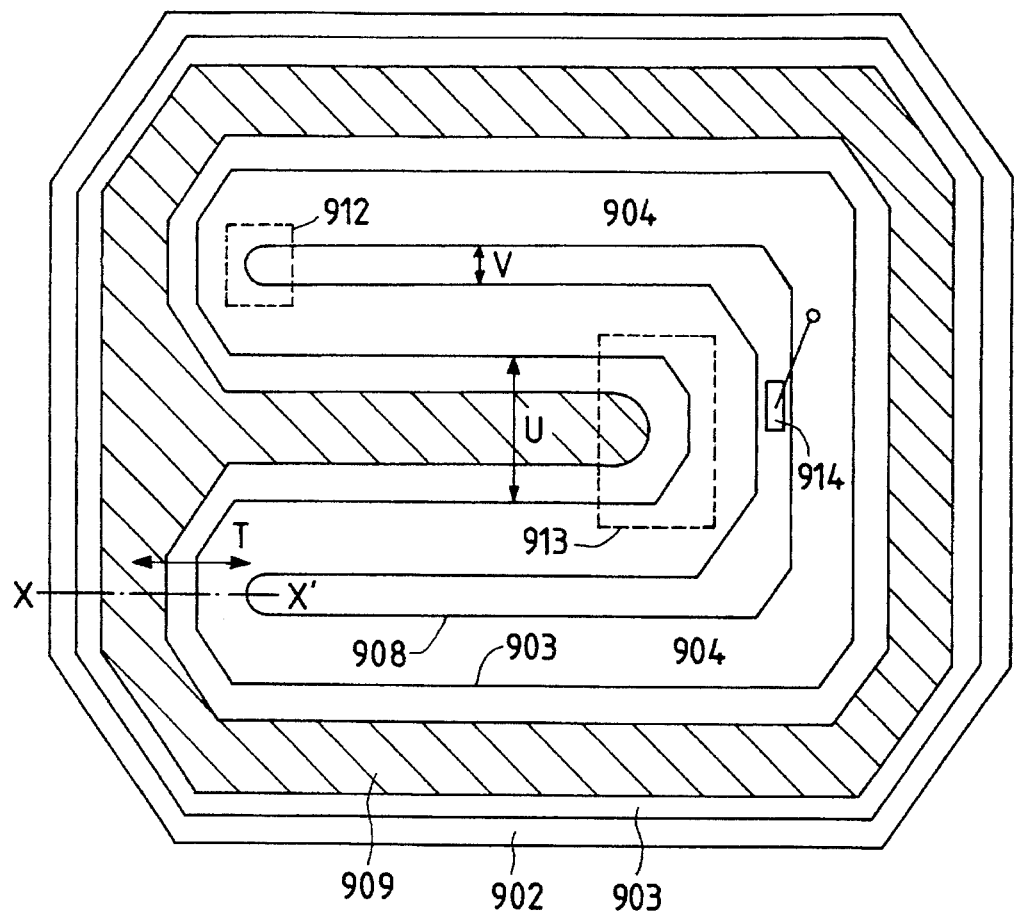
FIG. 19(a) is a plan view illustrating a configuration of a conventional horizontal-type DMOS.

FIG. 1(a) is a plan view illustrating a configuration of a high voltage MOSFET in accordance with a first embodiment of the present invention, and FIG. 1(b) is a cross-sectional view thereof taken along line X—X' in FIG. 1(a). It should be noted that, in the high voltage MOSFET of this embodiment, the overall planar structure is substantially identical to the conventional horizontal-type DMOS shown in FIG. 19(a). Also, FIG. 1(a) is a plan view in which a portion of the base layer, which exhibits a protruding shape in a plan view and is shown as the base corner portion 913 in FIG. 19(a), is illustrated in enlarged form.

First, the high voltage MOSFET in accordance with this embodiment will be described with reference to the cross-sectional view shown in FIG. 1(b). An n-type well layer 100 is formed on a p-type semiconductor substrate 101 by diffusion from the obverse surface side. This well layer 100 has a first region portion 103 and a second region portion 102 which oppose each other in such a manner as to sandwich a non-formation region 101a obtained by selectively leaving intact a partial region of the semiconductor substrate 101. An MOS section 125 is formed in the first region portion 103 of the well layer 100, while a drain section 126 is formed in the second region portion 102 thereof. On the MOS section 125 side, there are provided a p-type base layer 105 formed in such a manner as to extend from the first region portion 103 to the non-formation region portion 101a, as well as an $n^+$-type source layer 107 and a $p^+$-type base contact layer 108, which are formed in this base layer 105. A gate electrode 111 is formed so as to extend from an end of the source layer 107 to the surfaces of the base layer 105 and the well layer 103 via a gate oxide film 110. A source electrode 112 is connected to the source layer 107 and the base contact layer 108. The source electrode 112 has a field plate portion 112a which extends over a thick insulating film 115 toward a drain layer 109, which will be described later. Accordingly, the MOS section 125 has a structure in which the source layer 107 and the base layer 105 are double-diffused. In addition, a high voltage withstanding structure is formed in which the field plate portion 112a alleviates the concentration of an electric field at an end of the source layer 107.

Meanwhile, in the drain section 126, which is formed on the second region portion 102 side of the well layer 100, an $n^-$-type drain layer 109 is formed on the surface of the second region portion 102, and a drain electrode 113 is connected to the drain layer 109. On the MOS section 125 side of the drain electrode 113 is a field plate portion 113a which projects over the insulating film 115 in a manner similar to that of the source electrode 112. Accordingly, the concentration of the electric field at the MOS section 125 side end of the drain layer 109 is alleviated, and a high voltage withstanding structure is thereby formed.

Furthermore, in the high voltage MOSFET in accordance with this embodiment, a p-type offset layer 106 is formed on the surfaces of the base layer 105, the semiconductor substrate 101, and the second region portion 102 in such a manner as to extend between the base contact layer 108 in the base layer 105 and the drain layer 109.

In the high voltage MOSFET having the above-described configuration a portion underneath the offset layer 106 is selectively set as the non-formation area 101a where the N-well is not formed. Also, a partial region of the semiconductor substrate 101 is left intact, thereby providing the non-formation region (low-concentration region) 101a around the base corner portion in which the base layer 105 exhibits a protruding shape in a plan view of this high voltage MOSFET.

Figure 2:
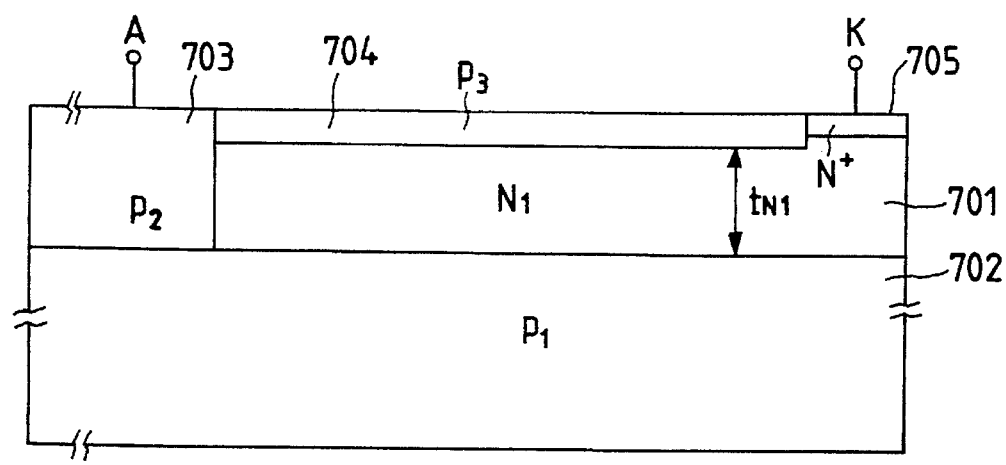
FIG. 2 is an explanatory diagram explaining a withstand voltage of an element of a semiconductor device having a PNP three-layered structure.

Before describing the voltage withstanding structure of the high voltage MOSFET in accordance with this embodiment, a PNP three-layered structure serving as a basis of the withstand voltage design of the device will be described with reference to FIG. 2. In FIG. 2, a model of this voltage withstanding device employs a PNP three-layered structure in which a p-type $P_1$ region 702, an n-type $N_2$ region 701, and a p-type $P_3$ region 704 are superposed in that order, and has a p-type P2 region 703 to which an anode A is connected and an $n^+$-type cathode region 705 to which a cathode K is connected. In this voltage withstanding device, when an impurity (acceptor) concentration $N_{A1}$ in the P1 region 702 is sufficiently greater than an impurity concentration $N_{A3}$ in the $P_3$ region 704, a depletion voltage $V_0$, at which the $N_1$ region 701 corresponding to the N well is depleted, is expressed by the following Formula (1):

$$V_0 = (q/2\epsilon) t_{N1}^2 \cdot N_{D1} (1 + N_{D1}/N_{A1}) \quad (1)$$

where, $N_{A1} \gg N_{A3}$

Here, q represents an elementary charge; $\epsilon$, a dielectric constant of the semiconductor; $t_{N1}$, the thickness of the $N_1$ region; and $N_{D1}$, an impurity (donor) concentration in the $N_1$ region.

On the other hand, in a case where the impurity concentration $N_{A3}$ in the $P_3$ region 704 is sufficiently greater than the impurity concentration $N_{A1}$ in the P1 region 702, the depleting voltage $V_0$ at the N1 region 701 is expressed by the following Formula (2):

$$V_0 = (q/2\epsilon) t_{N1}^2 \cdot N_{D1} (1 + N_{D1}/N_{A3}) \quad (2)$$

where, $N_{A1} \ll N_{A3}$

Now, if the withstand voltage of the high voltage MOSFET in accordance with this embodiment is considered from Formulae (1) and (2) above, since the impurity concentration in the base layer 105 corresponding to the P3 region is sufficiently greater than the impurity concentration in the semiconductor substrate 101 (non-formation region 101a) corresponding to the $P_1$ region, Formula (2) is applied to the voltage $V_0$ at which the first region portion 103 of the well layer 100 is depleted. The thickness of the first region portion 103 corresponding to $t_{N1}$ is approximately 4 μm. As for its impurity (donor) concentration, since the first region portion 103 is formed by ion injection, the impurity concentration in the vicinity of a junction portion is low. Hence, it follows from Formula (2) that the depletion voltage $V_0$ at the first region portion 103 becomes 50 V or less.

In addition, as shown in FIG. 1(a), if the high voltage MOSFET is seen in view of its plane (in a plane deeper than the offset layer 106 and shallower than the first region portion 103), portions of the well layer 100 oppose each other with the non-formation region 101a (a region of the semiconductor substrate 101) in the center placed therebetween, so that the PNP three-layered structure (described before with reference to FIG. 2) can be used as the NPN three-layered structure in the planar direction. Here, the thickness of the semiconductor substrate 101 corresponding to $t_{N1}$ is 20 to 50 μm, and the semiconductor substrate 101 is depleted at $V_0 = 50$ V or thereabouts.

With the high voltage MOSFET having the above-described configuration, if the voltage applied to the MOS section 125 becomes about 50 V, the first region portion 103 around the base layer 105 becomes depleted due to a depletion layer extending toward the first region portion 103 from a PN junction portion between the semiconductor substrate 101 and the first region portion 103 and from a PN junction portion between the base layer 105 and the first region portion 103, so that a current path is interrupted. In the high voltage MOSFET in accordance with this embodiment, the voltage value 50 V, at which the first region portion 103 around the base layer 105 become depleted, is sufficiently lower than a critical voltage value 100 to 300 V at which a conventional device having a degree of integration at the same level undergoes a breakdown. Accordingly, as the base corner portion where the field strength increases as a result of the formation of the element into a finer pattern is depleted by an applied voltage which is sufficiently lower than the critical voltage value, it is possible to alleviate the concentration of an electric field in the base corner portion. Hence, it is possible to substantially increase the withstand voltage at the base corner portion which has impeded the improvement of the withstand voltage in the conventional high voltage devices. In other words, the width $t_{N1}$ of the base layer can be reduced further. Therefore, the withstand voltage at the base corner portion is secured, and a targeted withstand voltage of 600 to 1200 V can be attained. Hence, it is possible to realize an integrated circuit device having a high withstand voltage while maintaining a high degree of integration in a case where a power MOSFET, such as this high voltage MOSFET, and its control circuit portion are integrated in the same chip.

Here, in the high voltage MOSFET in accordance with this embodiment, the N-well non-formation region 101a, i.e., a partial region of the semiconductor substrate 101, is present in a current path from the MOS section 125 side to the drain section 126, but the current path is not efficient. However, such a structure (the N-well non-formation region on the current path) is used only in a field-concentrated portion such as the base corner portion in an integrated circuit device having a several-mm square element area, and its proportion in the overall device is very small. Moreover, the spaced-apart distance between the first region portion 103 and the second region portion 102 in the well layer 100 is 50 to 100 μm or thereabouts, and if the use for switching a power source or the like is taken into consideration, the on-resistance of the device becomes small at 5 Ω or less. From the above, in this high voltage MOSFET, the loss of a current gain entailed by the provision of the N-well non-formation region on the current path can be held down to several percentages or less. Rather, by increasing the degree of integration from reducing the width of the base layer 105, it becomes possible to reduce the on-resistance per unit area by half as compared with a conventional device having a large width of the base layer and a radius of curvature of about 100 μm. In addition, since the source electrode 112 and the drain electrode 113 are respectively provided with the field plate portions 112a and 113a, the electric field, which may be concentrated in the respective layers, can be alleviated, and the withstand voltage of this high voltage MOSFET can be improved further. Accordingly, with the high voltage MOSFET in accordance with this embodiment, it is possible to attain the compatibility of a high withstand voltage and a high current output due to low on-resistance.

In addition, in a case where the terminating position (a side end of the non-formation portion in the depthwise direction) of the MOS section 125 side (first region portion 103) is moved further leftward so as to terminate below the lower side of the gate electrode 111, as shown by the two-dotted dash line in FIG. 1(b), its spaced-apart distance between the first region portion 104 and second region portion 102 is enlarged further, and the current driving capability declines. However, since the base corner portion is completely surrounded by the semiconductor substrate 101, it is possible to prevent the concentration of the electric field in the base corner portion, and the withstand voltage can be improved further.

Thus, with the high voltage MOSFET in accordance with this embodiment, as a region of the semiconductor substrate 101 is selectively left intact in a vicinity of the periphery of the base corner portion where the electric field concentrates as a result of the formation of a finer pattern of the device, a region surrounding the base corner portion is set as a high resistance region (low concentration region). The high resistance region is depleted by a relatively low applied voltage. As a result, the concentration of the electric field in the base corner portion does not occur, and a high-voltage-withstanding structure can be obtained. Accordingly, since the withstand voltage at the base corner portion can be secured, a targeted withstand voltage for the device can be obtained, and a high voltage withstanding, high-reliability MOSFET can be obtained while satisfying the degree of integration.

Second Embodiment

Figure 3:
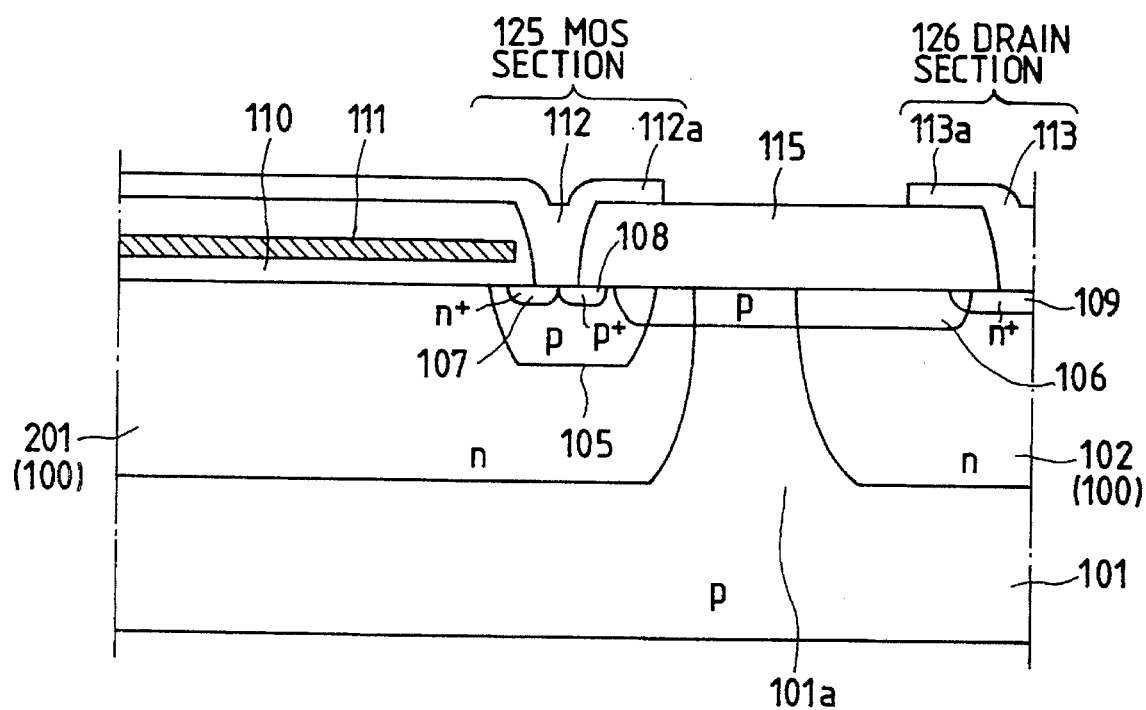
FIG. 3 is a cross-sectional view illustrating a configuration of a high voltage MOSFET in accordance with a second embodiment of the present invention.

FIG. 3 is a cross-sectional view illustrating a configuration of a high voltage MOSFET in accordance with a second embodiment of the present invention. It should be noted that, in FIG. 3, portions common to those of the high voltage MOSFET in accordance with the first embodiment shown in FIG. 1 are denoted by the same reference numerals, and description thereof will be omitted.

The high voltage MOSFET in accordance with this embodiment differs from the high voltage MOSFET in accordance with the first embodiment in that a first region portion 201 in the MOS section 125 side well layer 100 completely surrounds the base layer 105 and reaches the bottom of the offset layer 106.

With this high voltage MOSFET having the above-described configuration as well, the impurity concentration at the PN junction portion of the first region portion 201 in the well layer 100 formed by ion injection is low. Also, the depletion layer extends toward the first region portion 201 from the PN junction portion with the semiconductor substrate 101 and from the PN junction portion with the base layer 105, so that the first region portion 201 surrounding the base layer 105 becomes depleted. As a result, the electric field at the base corner portion, which is a tip portion of the base layer 105, is alleviated. Since the withstand voltage is not rate-determined by the base corner portion, a targeted withstand voltage for the device can be obtained. Accordingly, since the withstand voltage of the device can be improved in a state in which the degree of integration of this high voltage MOSFET and its control circuit portion and the like is maintained at a high level, it is possible to produce a compact and high-reliability integrated circuit device.

Third Embodiment

Figure 4A:
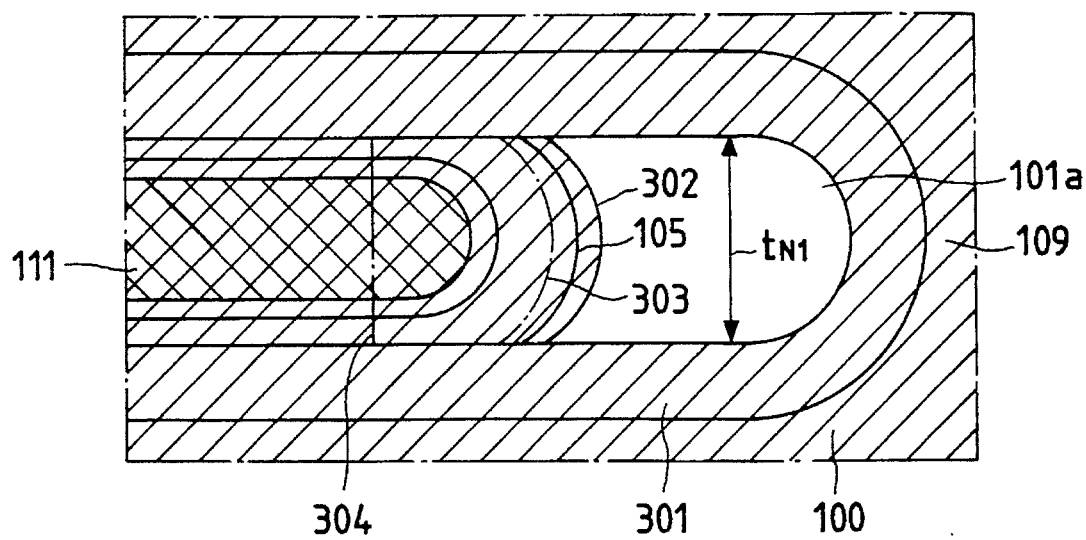
FIG. 4(a) is a plan view illustrating a configuration of a high voltage MOSFET in accordance with a third embodiment of the present invention.
Figure 4B:
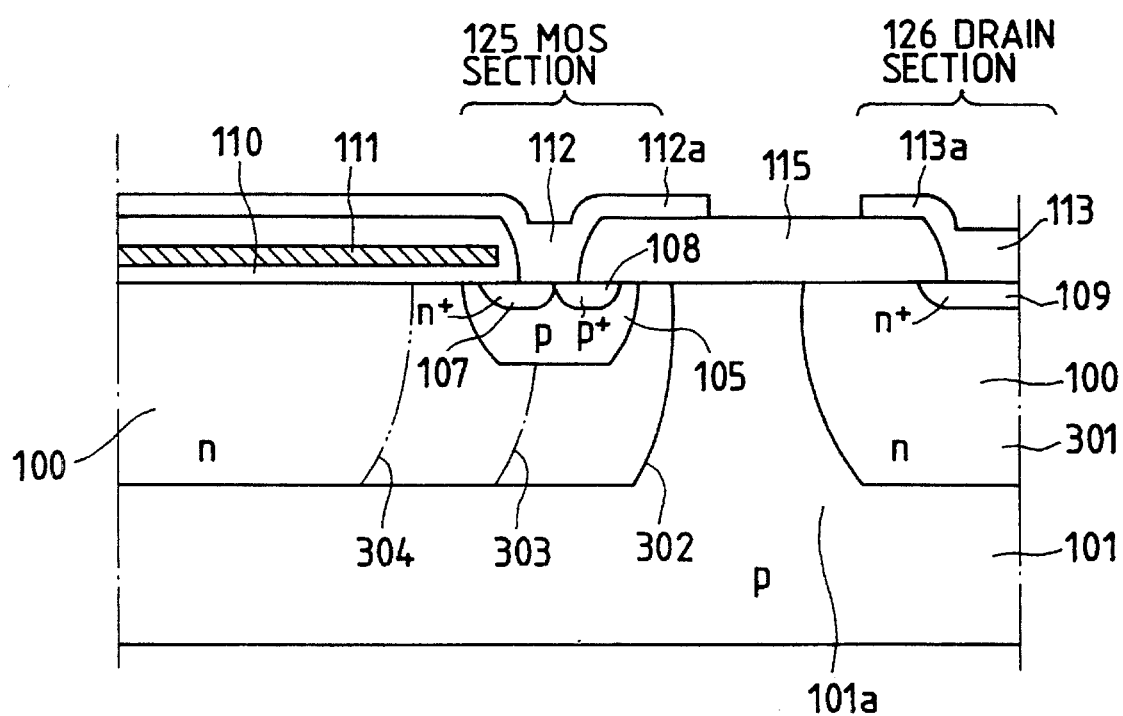
FIG. 4(b) is a cross-sectional view taken along line X—X' in FIG. 4(a)

FIG. 4(a) is a plan view illustrating a configuration of a high voltage MOSFET in accordance with a third embodiment of the present invention, and FIG. 4(b) is a cross-sectional view thereof. It should be noted that, in FIGS. 4(a) and 4(b), portions common to those of the high voltage MOSFET in accordance with the second embodiment shown in FIG. 3 are denoted by the same reference numerals, and description thereof will be omitted.

The high voltage MOSFET in accordance with this embodiment differs from the high voltage MOSFET in accordance with the second embodiment in that the offset layer extending from the base layer 105 to the drain layer 109 is not provided. In the high voltage MOSFET in accordance with this embodiment, there are cases where electrons released from the source layer 107 flow through the surface portion of the semiconductor substrate 101 and a second region portion 301 of the well layer 100. It is necessary to take into consideration the effect of the electrons becoming hot electrons by being captured in the insulating film 115 at an end of the drain layer 109 where the electric field is liable to concentrate. However, since the source 107 side of the drain electrode 113 is formed as the field plate portion 113a projecting over the insulating film 115, the electric field at the end of the drain layer 109 is alleviated. Hence, the occurrence of hot electrons is suppressed. Meanwhile, at the base corner portion which is the tip portion of the base layer 105, in the same way as the high voltage MOSFET in the second embodiment shown in FIG. 3, a high voltage withstanding structure is formed in which the electric field is alleviated as the first region portion 302 of the well layer 100 is depleted. Hence, it is possible to obtain advantages similar to those of the high voltage MOSFETs in the first and second embodiments described above.

It should be noted that, in the high voltage MOSFET in accordance with this embodiment, the terminating position of the first region portion 302 of the well layer 100 is not limited to the lower side of the insulating film 115. Also, in the same way as the high voltage MOSFETs in the first and second embodiments, it is possible to form a first region portion 303 which terminates at the bottom of the base layer 105 as indicated by the one-dot-dash line in FIG. 4(b) or a first region portion 304 which terminates on the lower side of the gate electrode 111 as indicated by the two-dotted dash line in FIG. 4(b). In either case, it is possible to obtain an advantage similar to this high voltage MOSFET.

Fourth Embodiment

Figure 5:
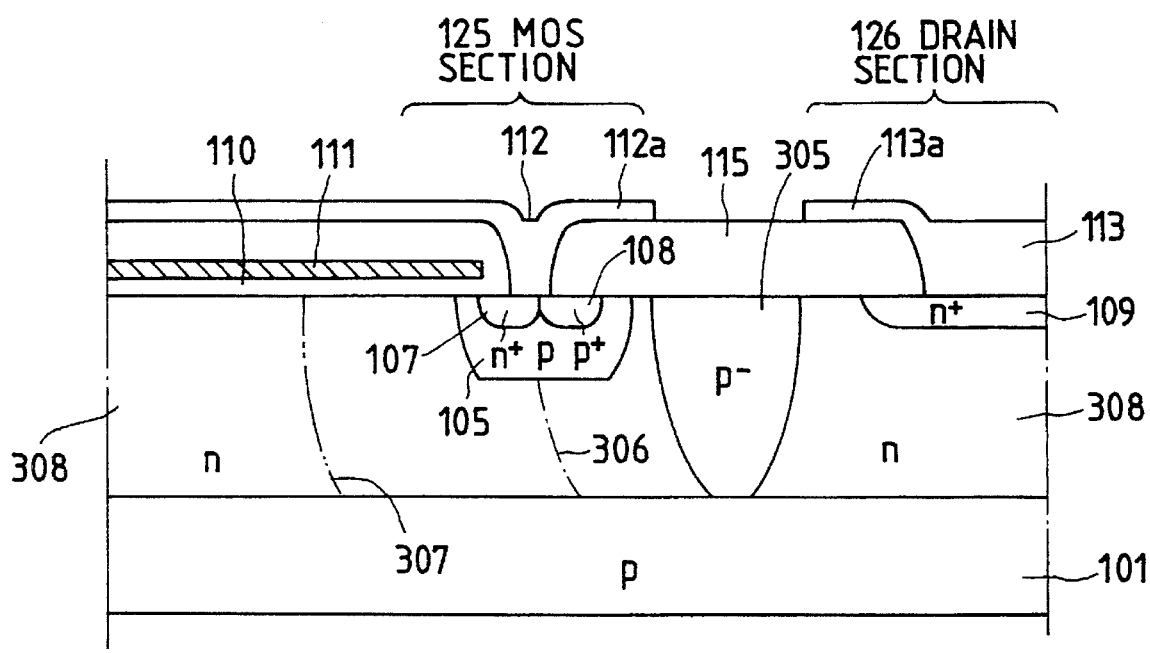
FIG. 5 is a cross-sectional view illustrating a configuration of a high voltage MOSFET in accordance with a fourth embodiment of the present invention.

FIG. 5 is a cross-sectional view illustrating a configuration of a high voltage MOSFET in accordance with a fourth embodiment of the present invention. It should be noted that, in FIG. 5, portions common to those of the high voltage MOSFET in accordance with the third embodiment shown in FIG. 4 are denoted by the same reference numerals, and description thereof will be omitted.

The high voltage MOSFET in accordance with this embodiment differs from the high voltage MOSFET in accordance with the third embodiment in that an n-type semiconductor layer 308 is not an N-well layer formed by ion injection but an epitaxial growth layer deposited on the semiconductor substrate 101. That is, in the high voltage MOSFET in accordance with this embodiment, the n-type epitaxial layer 308 formed by epitaxial growth is provided on the semiconductor substrate 101. This epitaxial layer 308 has a first region portion and a second region portion which oppose each other with a p⁻-type semiconductor region 305 placed therebetween. The p⁻-type semiconductor region 305 reaches the semiconductor substrate 101 from the obverse surface side of the epitaxial layer 308. It should be noted that the semiconductor region 305 is selectively formed around a high voltage element, and is also used to separate the epitaxial layer 308 on the semiconductor substrate 101 into an isolated island for forming an element.

As compared with the high voltage MOSFETS in accordance with the first to third embodiments, this high voltage MOSFET having the above-described configuration has a substantially similar structure although there are differences between the N-well and the epitaxial growth layer and between the semiconductor substrate and the semiconductor region. Accordingly, with this high voltage MOSFET in accordance with this embodiment as well, it is possible to obtain advantages similar to those of the high voltage MOSFETs in accordance with the first to third embodiments. It should be noted that, in the high voltage MOSFET in accordance with this embodiment as well, the position of the end of the semiconductor region 305 is not limited to this embodiment. It is possible to form a semiconductor region 306 which terminates at the bottom of the base layer 105, as indicated by the one-dot-dash line in FIG. 5, or a semiconductor region 307 which terminates on the lower side of the gate electrode 111, as indicated by the two-dotted dash line in FIG. 5. Advantages similar to those described above can be obtained in the respective cases.

Fifth Embodiment

Figure 6A:
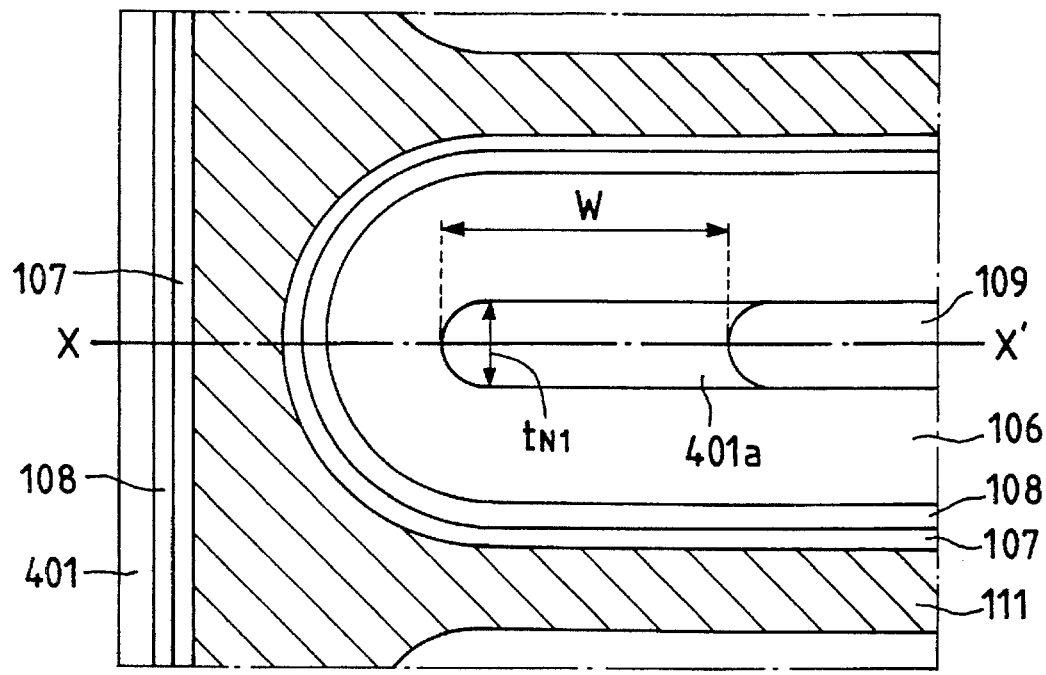
FIG. 6(a) is a plan view illustrating a configuration of a high voltage MOSFET in accordance with a fifth embodiment of the present invention.
Figure 6B:
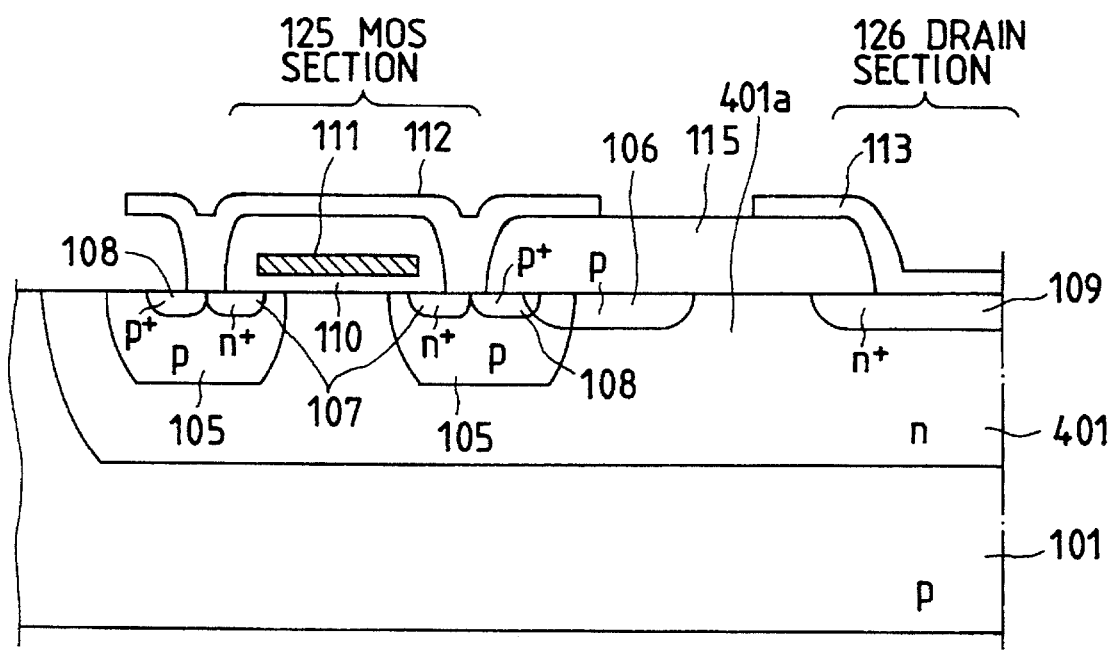
FIG. 6(b) is a cross-sectional view taken along line X—X' in FIG. 6(a)
Figure 19B:
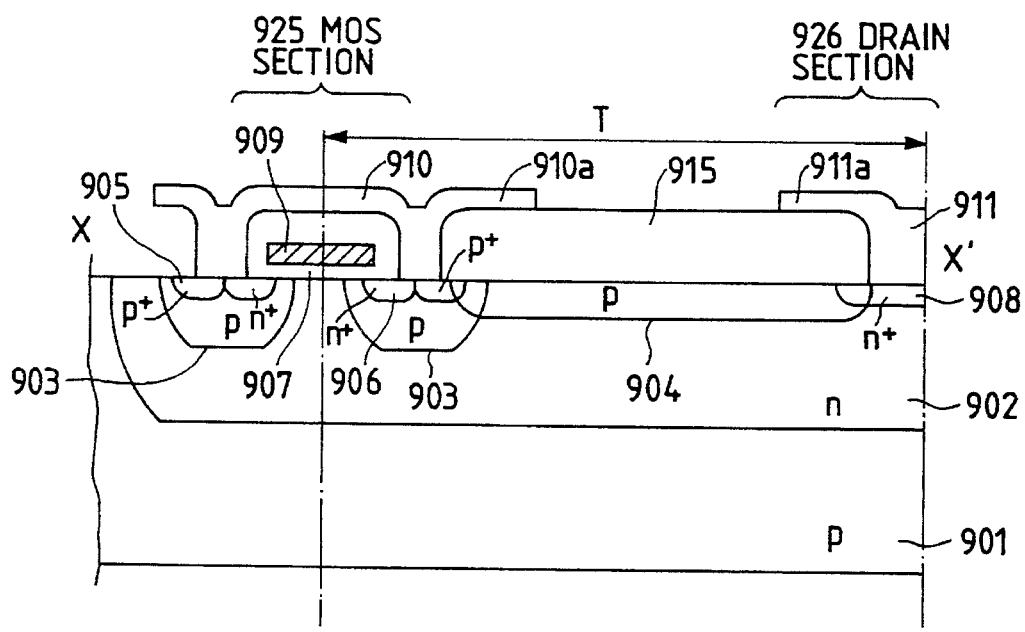
FIG. 19(b) is a cross-sectional view taken along line X—X' in FIG. 19(a).

FIG. 6(*a*) is a plan view illustrating a configuration of a high voltage MOSFET in accordance with a fifth embodiment of the present invention, and FIG. 6(*b*) is a cross-sectional view thereof taken along line X—X' in FIG. 6(*a*). In the high voltage MOSFET in accordance with this embodiment, its overall planar structure is substantially similar to that of the conventional horizontal-type DMOS shown in FIG. 8. FIG. 6(*a*) is a plan view in which a portion of the drain layer, which exhibits a protruding shape in a plan view and is shown as the drain corner portion 912 in FIG. 19(*a*), is illustrated in enlarged form. It should be noted that, in FIGS. 6(*a*) and 6(*b*), portions common to those of the high voltage MOSFET in accordance with the first embodiment shown in FIG. 1 are denoted by the same reference numerals, and description thereof will be omitted.

When the high voltage MOSFET of this embodiment is seen in a plan view, a well layer 401 is formed around the drain corner portion in which the drain layer 109 exhibits a protruding shape in a plan view, by leaving a non-formation region 401*a* of the offset layer 106. It should be noted that the spaced-apart distance W between the drain corner portion and an end of the offset layer 106 is set to be 50 to 100 μm. Here, if the high voltage MOSFET in accordance with this embodiment is seen in a plan view, portions of the offset layer 106 oppose each other with the non-formation region 401*a* placed in the center therebetween, and a PNP three-layered structure is thereby formed. Accordingly, if the PNP three-layered structure described before with reference to FIG. 2 is used planarly, the width of the non-formation region 401*a* becomes 5 μm and corresponds to $t_{N1}$. In addition, since the impurity concentration in the well layer 401 is also substantially similar to that of the high voltage MOSFET in accordance with the first embodiment, the well layer 401 becomes depleted at approximately 50 V. Accordingly, in the drain corner portion where the field strength increases as a result of the formation of the device into a finer pattern, if the voltage applied to the drain section 126 becomes 50 V or thereabouts, the well layer 401 becomes depleted. Hence, even if the applied voltage is increased more than that level, the field strength of the drain corner portion will not increase. Accordingly, the well layer 401 becomes depleted at an applied voltage (50 V) which is sufficiently lower than a critical voltage (100 to 300 V) used when a conventional integrated circuit device is formed with a fine pattern. Also, it is possible to prevent a breakdown of the drain corner portion due to the concentration of the electric field. Consequently, it is possible to realize a targeted withstand voltage of 600 to 1200 V for the device. Furthermore, since the width of the drain layer 109, which substantially determines the degree of integration of the device, can be reduced to 5 μm or thereabouts, the degree of integration of the device improves, and the on-resistance per unit area can be reduced. Accordingly, with the high voltage MOSFET in accordance with this embodiment, it is possible to attain the compatibility of a high withstand voltage and a high current output due to low on-resistance.

Sixth Embodiment

Figure 7A:
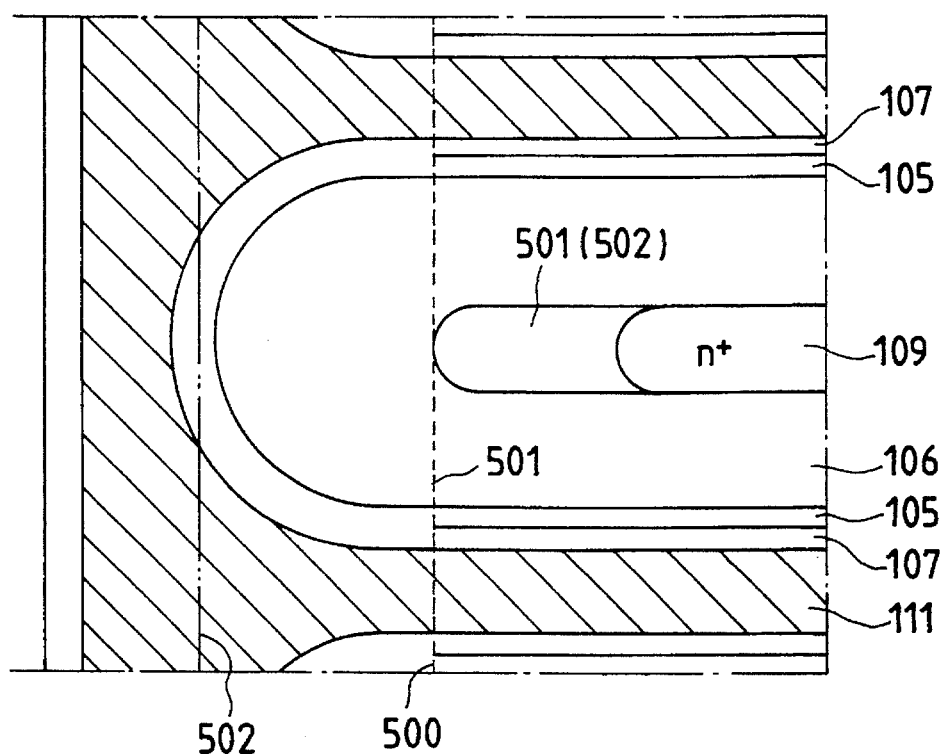
FIG. 7(a) is a plan view illustrating a configuration of a high voltage MOSFET in accordance with a sixth embodiment of the present invention.
Figure 7B:
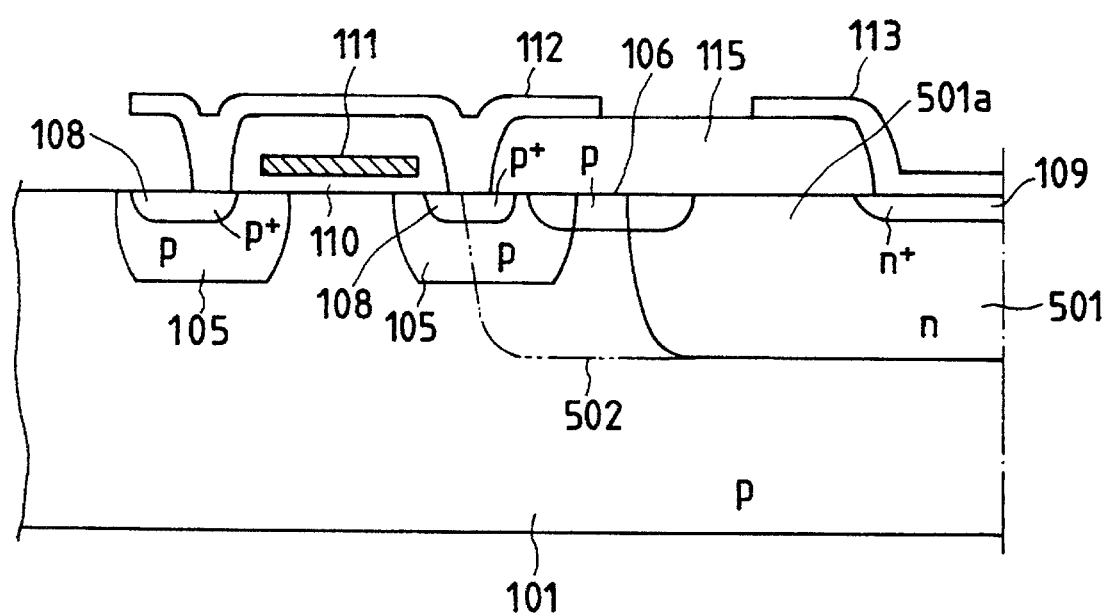
FIG. 7(b) is a cross-sectional view taken along line X—X' in FIG. 7(a)

Next, a sixth embodiment in accordance with the present invention will be described with reference to FIGS. 7(*a*) and 7(*b*). FIG. 7(*a*) is a plan view illustrating a configuration of a high voltage MOSFET in accordance with the sixth embodiment, and FIG. 7(*b*) is a cross-sectional view thereof. It should be noted that, in FIG. 7, portions common to those of the high voltage MOSFET in accordance with the fifth embodiment shown in FIG. 6 are denoted by the same reference numerals, and description thereof will be omitted. The high voltage MOSFET in accordance with this embodiment differs from the high voltage MOSFET in accordance with the fifth embodiment in that a well layer 501 terminates at the bottom of the offset layer 106. In addition, since the source layer 107 formed in the base layer 105 terminates at the same line as the end of the well layer 501, in the cross-sectional view shown in FIG. 7(*b*), the base layer 105 is arranged to be formed on the semiconductor substrate 101, and the source layer 107 is not found in the base layer 105.

With this high voltage MOSFET having the above-described configuration, since the arrangement provided is such that the obverse surface side of the drain corner portion, which is the tip portion of the drain layer 109, abuts the well layer 501, the drain corner portion where the electric field is liable to concentrate is capable of improving its withstand voltage since the electric field is alleviated as the well layer 501 (a non-formation region 501*a* of the offset layer) becomes depleted. Accordingly, in the same way as the high voltage MOSFET in accordance with the fifth embodiment, the drain corner portion, at which the electric field increases as a result of the formation of the device into a finer pattern and which has hitherto determined the withstand voltage of the element, can be provided with a high voltage withstanding structure. Consequently, the withstand voltage can be improved while maintaining a high degree of integration and thus improve the reliability of the device. It should be noted that the terminating position of the well layer may be at the bottom of the base layer 105, as indicated by the two-dotted dash line in FIGS. 7(*a*) and (*b*).

Seventh Embodiment

Figure 8:
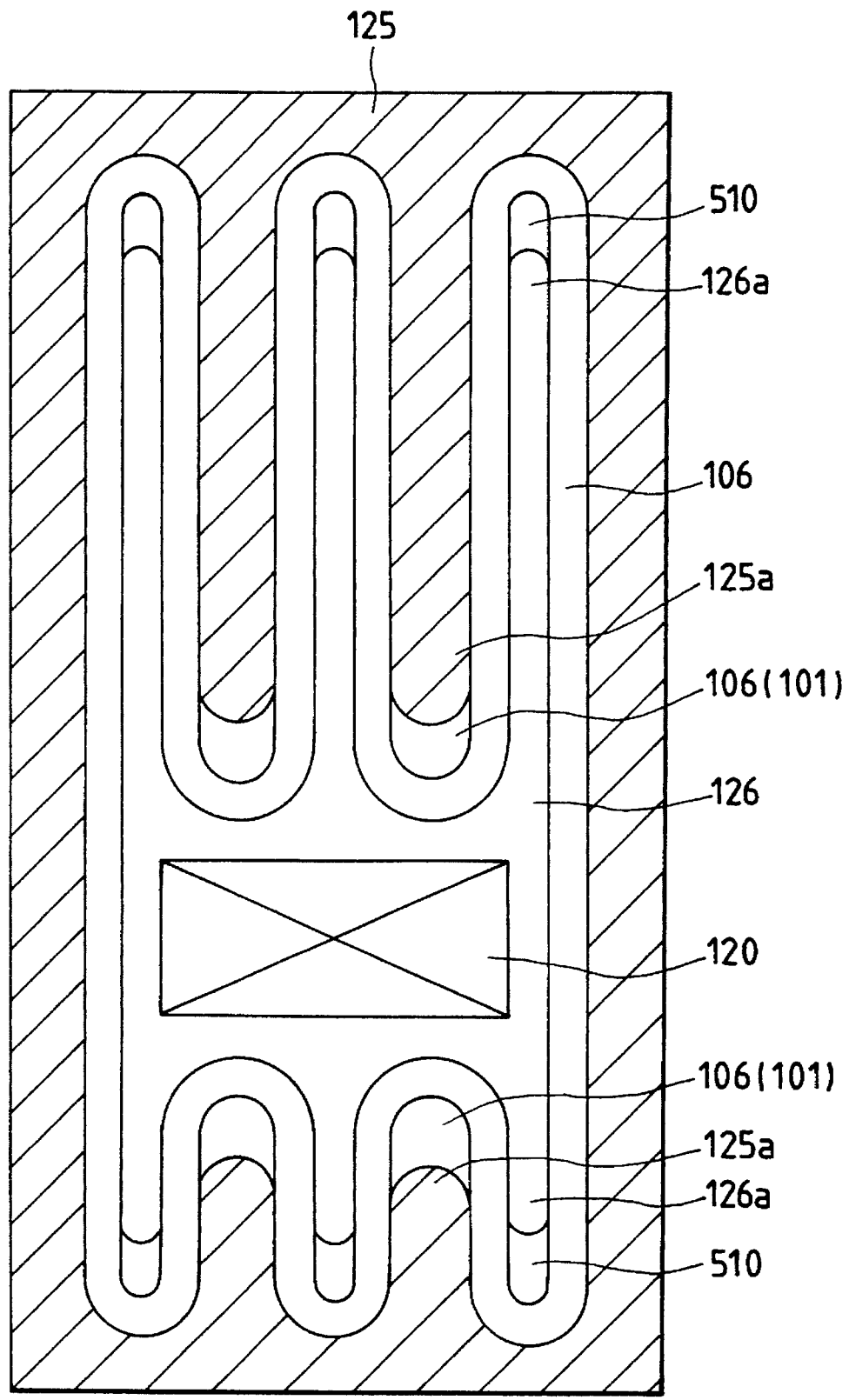
FIG. 8 is a plan view illustrating a configuration of a high voltage MOSFET in accordance with a seventh embodiment of the present invention.

FIG. 8 shows a high voltage MOSFET in accordance with a seventh embodiment of the present invention. It should be noted that, in FIG. 8, portions common to those of the high voltage MOSFET in accordance with the fifth embodiment shown in FIG. 6 are denoted by the same reference numerals.

A point to be noted in the high voltage MOSFET in accordance with this embodiment lies in its planar structure. In order to allow the MIS section (input terminal region) 125 to project toward the drain section (output terminal region) 126, highly integrated regions in which the MIS section 125 and the drain section 126 are juxtaposed in an interdigitated manner, are respectively formed on one side of a drain pad opening portion 126 and on the other side thereof. Here, in the MIS section 125, the offset layer 106 is formed around a base corner portion 125a projecting toward the drain pad opening portion 120, and a region on the lower side of this offset layer 106 is formed as the semiconductor substrate 101 region. Accordingly, as described before in the first to fourth embodiments, the concentration of the electric field in the base corner portion 125a is alleviated, and the withstand voltage of the element is not determined by this portion.

Meanwhile, since the offset layer 106 is not formed around a drain corner portion 126a in which the drain layer 126 exhibits a protruding shape in a plan view, an n-type well layer 510 remains. Accordingly, in the same way as in the above-described fifth and sixth embodiments, it is possible to alleviate the concentration of electric field in the drain corner portion 126a. It should be noted that the radii of curvature of the base corner portion 125a and the drain corner portion 126a are minimum values, i.e., 14.5 μm for the base corner portion 125a and 2.5 μm for the drain corner portion 126a. In addition, the linear length of projections projecting in the shape of comb teeth is 2000 μm in the case of the longer projections and 100 μm in the case of the shorter projections, and the device size of this high voltage MOSFET is 3 mm×0.6 mm.

The high voltage MOSFET having the above-described configuration is characterized in that the MIS section 125 projects toward the drain section 126, and that highly integrated regions, which are attained by increasing the channel width, are formed both on one side of the drain pad opening portion 120 and on the other side thereof in such a manner as to oppose each other with the drain pad opening portion 120. For this reason, since a curvature portion does not exist around the side of the drain pad opening portion 120, the withstand voltage of the element is not rate-determined by an outer peripheral end of the drain pad opening portion 120 in the manner experienced by the conventional high voltage MOSFET. Also, it becomes unnecessary to take a measure against the concentration of the electric field in a region surrounding the drain pad opening portion 120. It goes without saying that local withstand voltages at the base corner portion 125a and the drain corner portion 126a are sufficiently secured, so that it is possible to reduce the on-resistance by means of high integration.

Eighth Embodiment

Figure 9:
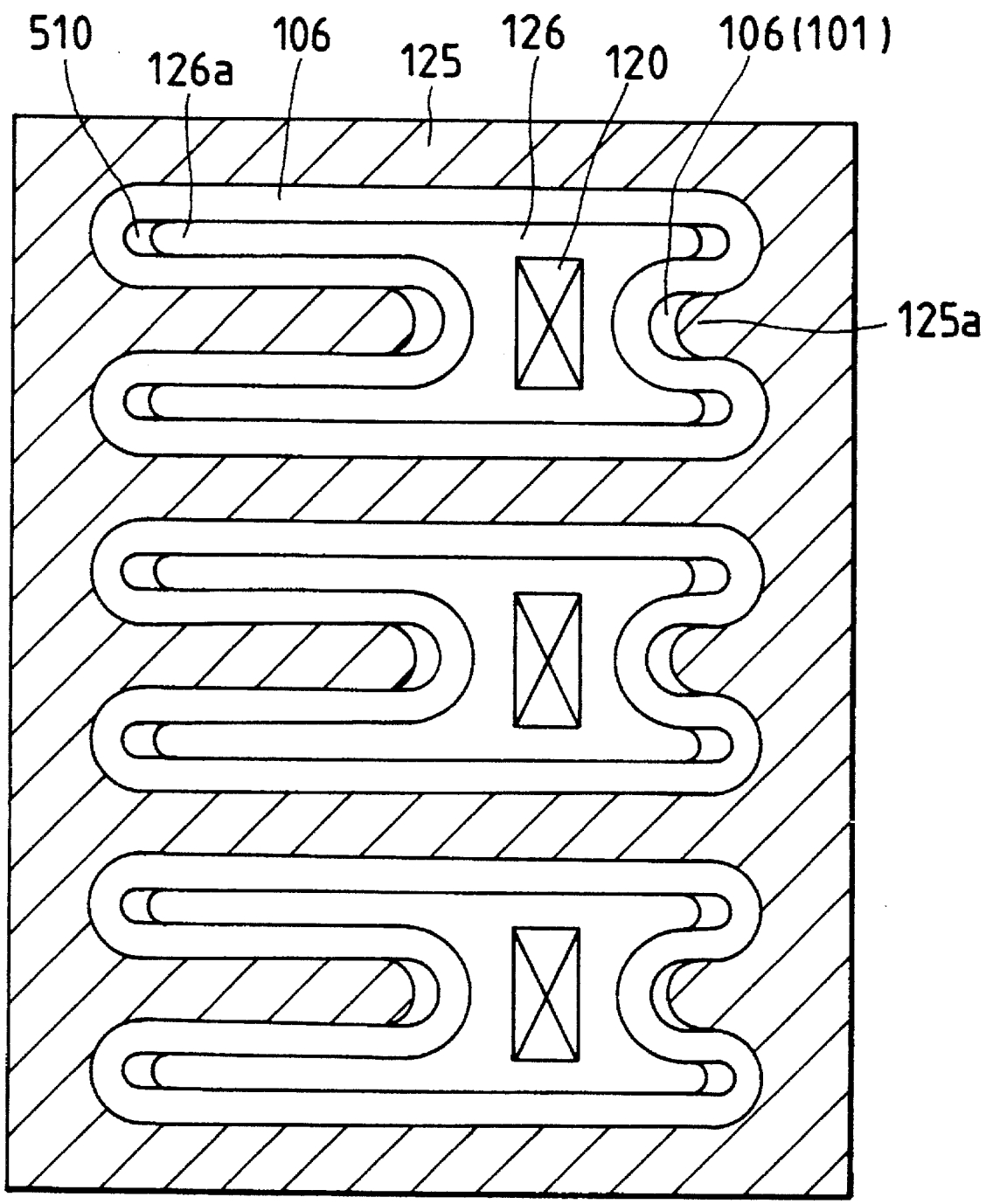
FIG. 9 is a plan view illustrating a configuration of a high voltage MOSFET in accordance with an eighth embodiment of the present invention.

Next, referring to FIG. 9, an eighth embodiment of the present invention will be described. It should be noted that, in the high voltage MOSFET shown in FIG. 9, portions common to those of the high voltage MOSFET in accordance with the seventh embodiment shown in FIG. 8 are denoted by the same reference numerals, and description thereof will be omitted.

The high voltage MOSFET in accordance with this embodiment is characterized in that element sections, each being highly integrated and having a high withstand voltage as described above with reference to FIG. 8, are formed in three rows in parallel. Namely, the drain pad opening portion 120 to which a wire is conductively connected is provided on a center side of the drain section 126. The MIS section 125 and the drain section 126 exhibit an interdigitated shape by means of projections projecting from the MIS section 125, which is a region surrounding the drain section 126, toward the respective drain pad opening portions 120. In this high voltage MOSFET, a portion surrounding the base corner portion 125a is the semiconductor substrate 101 (offset layer 106), and a portion surrounding the drain corner portion 126a is the well layer 510. The respective portions are low-concentration, high-resistance regions. Here, in the element sections juxtaposed in three rows, the number of drain region rows in the shape of comb teeth which are formed by the projections of the MIS section 125 is determined by the current capacity, a pad interval necessary at the time of bonding, and the like. It should be noted that, in this high voltage MOSFET, the radius of curvature of the base corner portion 125a is 14.5 μm, while the radius of curvature of the drain corner portion 126a is 2.5 μm, the respective values being minimum values. In addition, the linear length of the projections projecting in the shape of comb teeth is 2000 μm in the case of the longer projections and 100 μm in the case of the shorter projections, and the device size is 3 mm×1.2 mm.

The high voltage MOSFET having the above-described configuration is free of the concentration of the electric field on the sides of the drain pad opening portion 120, and is capable of attaining a high withstand voltage and a low on-resistance due to high integration at the same time, in the same way as the high voltage MOSFET in accordance with the above-described eighth embodiment. Furthermore, since the MIS section 125, which is an input terminal region, and the drain section 126, which is an output terminal region, are formed interdigitatedly on both sides of the drain pad opening portion 120, it was possible to increase the channel width per unit area by 13% as compared with the high voltage MOSFET in accordance with the seventh embodiment shown in FIG. 8. Thus, since the high voltage MOSFET in accordance with this embodiment is capable of further improving the degree of integration, it is possible to increase an output current by means of the low on-resistance.

Ninth Embodiment

Figure 10A:
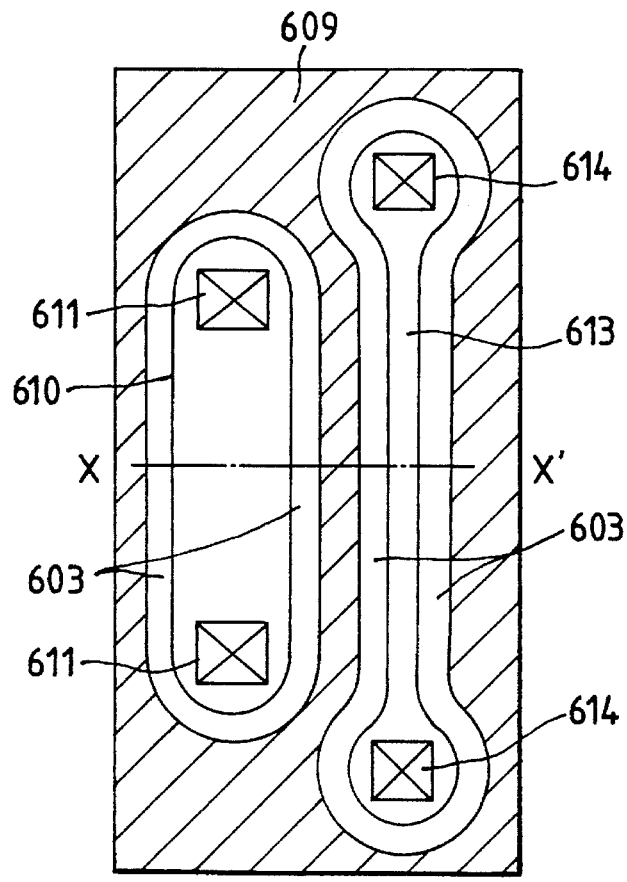
FIG. 10(a) is a plan view illustrating a configuration of a high voltage MOSFET in accordance with a ninth embodiment of the present invention.
Figure 10B:
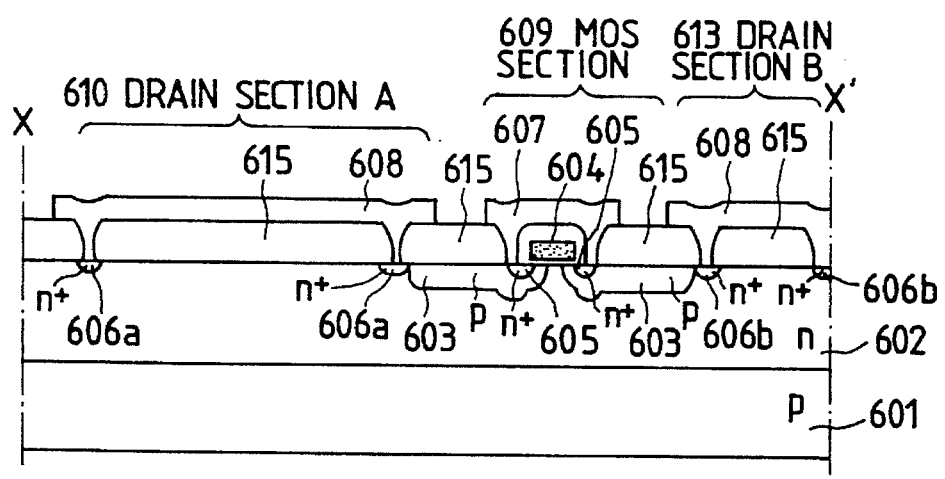
FIG. 10(b) is a cross-sectional view taken along line X—X' in FIG. 10(a)

FIG. 10(a) is a plan view illustrating a configuration of a high voltage MOSFET in accordance with a ninth embodiment of the present invention, and FIG. 10(b) is a cross-sectional view thereof taken along line X—X' in FIG. 10(a). First, the high voltage MOSFET in accordance with this embodiment will be described with reference to the cross-sectional view shown in FIG. 10(b). An n-type well layer 602 is formed on a p-type semiconductor substrate 601 by means of diffusion formation or the like. A pair of diffusion-formed p-type semiconductor regions (offset layers) 603 are formed on the obverse surface side of the well layer 602, and an $n^+$-type source layer 605 is formed in each of these offset layers 603. A gate electrode 604 is formed in such a manner as to extend between this pair of source layers 605 via a gate oxide film, thereby forming a MOS section 609. In addition, an n⁺-type drain layer 606a is formed on one side (left-hand side) of the MOS section 609, thereby forming a drain section A 610. Meanwhile, an n⁺-type drain layer 606b is formed on the other side (right-hand side) of the MOS section 609, thereby forming a drain section B 613. Here, a source electrode 607 is connected to the source layer 605, and this source electrode 607 has field plate portions respectively projecting over insulating films 615 toward the drain section A 610 and the drain section B 613, which will be described later. Also, drain electrodes 608 are respectively connected to the drain layer 606a of the drain section A 610 and the drain layer 606b of the drain section B 613, and the MOS section 609 side of this drain electrode 608 is formed as a field plate portion projecting over the insulating film 615.

A point to be noted in the high voltage MOSFET (horizontal-type n-channel type MOSFET) in accordance with this embodiment lies in its planar structure shown in FIG. 10(*a*). A first point lies in that drain pad opening portions 614, which are formed at both ends of the drain section B 613, are formed by being offset outwardly with respect to drain pad opening portions 611, which are formed at both ends of the drain section A 610 adjacently confronting the drain section B 613, in the lengthwise direction of parallels formed by the drain section A 610 and the drain section B 613. A second point lies in that, in the drain section B 613, the width of its non-formation region portion where the drain pad opening portion 614 is not formed is set to be smaller than the width of its end where the drain pad opening portion 614 is formed. Here, the region width of the drain section A 610 is set to be 184 μm, whereas the region width at the end of the drain section B 613 is set to be 184 μm, and the region width at the central portion (the pad non-formation region portion) is set to be 5 μm.

Figure 11:
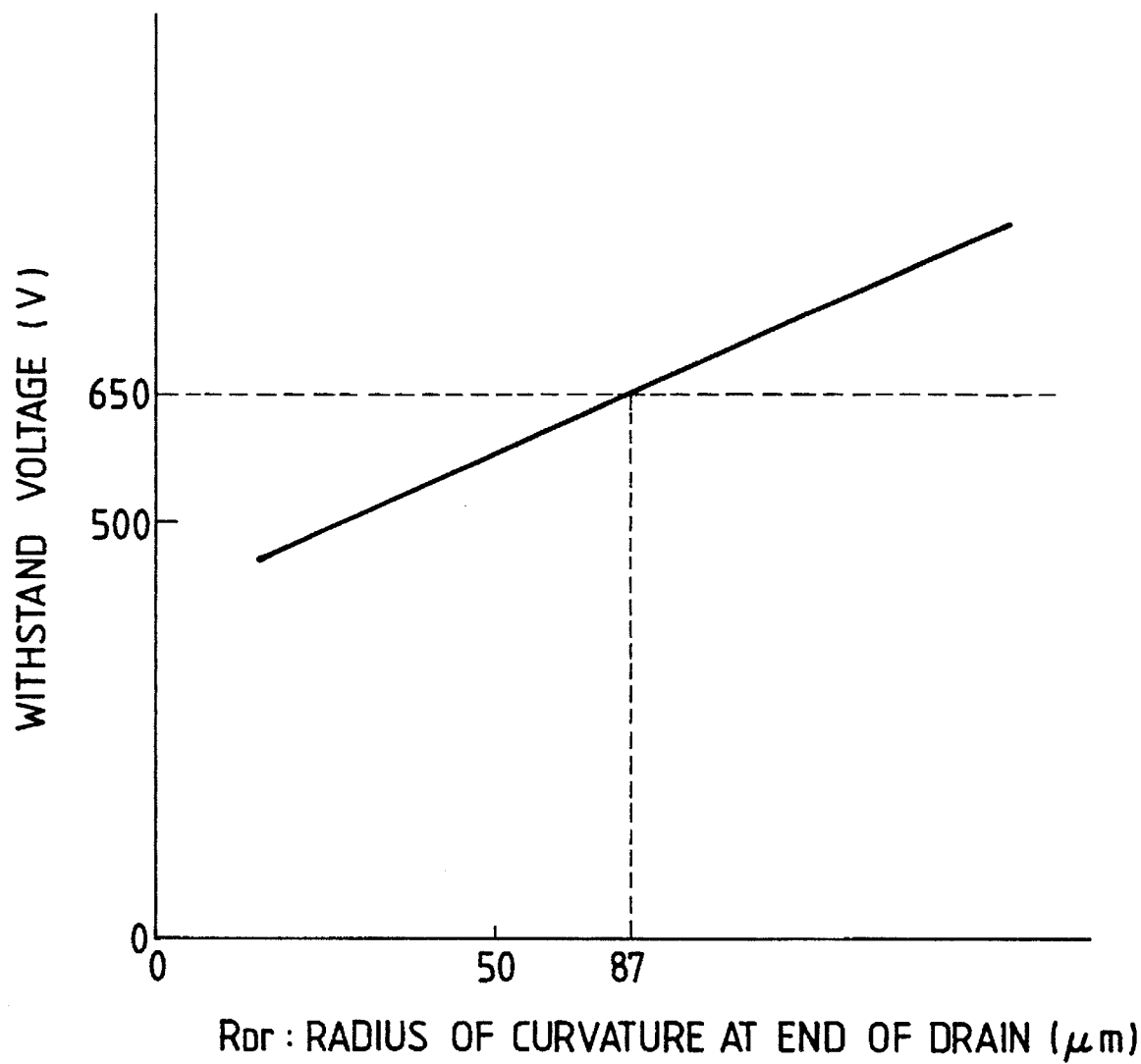
FIG. 11 is a graph illustrating dependence of the withstand voltage of a device on the radius of curvature.

In such a high voltage MOSFET, first, with respect to its cross-sectional structure, the source-drain distance is 97 μm, the thickness of the gate oxide film is 250 Å, the gate length is 14 μm, the surface concentration at the semiconductor substrate 601 is $1.6 \times 10^{14}$ cm⁻³, the surface concentration at the well layer 602 is $2.0 \times 10^{16}$ cm⁻³, and the surface concentration at the offset layer 603 is $9.0 \times 10^{16}$ cm⁻³. Accordingly, it is possible to attain a withstand voltage of 650 V by virtue of such a cross-sectional structure. Meanwhile, with respect to the planar structure, 87 μm or more is secured as the radius of curvature at the end of the drain section A 610 and the radius of curvature at the end of the drain section B 613, respectively. This value (the radius of curvature of 87 μm) is a minimum value required for attaining the withstand voltage of 650 V as shown in FIG. 11. Thus, in this high voltage MOSFET, its structure is capable of attaining the withstand voltage of 650 V in terms of its cross-sectional and planar structures, so that the targeted withstand voltage of 650 V can be attained. Furthermore, in this high voltage MOSFET, as the drain pad opening portions 614 of the drain section B 613 are formed in such a manner as to be offset outwardly in the lengthwise direction of parallels relative to drain pad opening portions 611 of the drain section A 610, even if the inter-drain pitch between the drain section A 610 and the drain section B 613, which are located adjacent to each other, is reduced, the substantial spaced-apart distance between the drain pad opening portion 611 and the drain pad opening portion 614 can be secured in correspondence with a required withstand voltage. Accordingly, since the inter-drain pitch can be reduced without causing a decline in the withstand voltage, the degree of integration of the element can be increased, and a low on-resistance can be obtained. It should be noted that, in this high voltage MOSFET, the length of one side of the drain pad opening portion 611 and the length of one side of the drain pad opening portion 614 are equal and are 110 μm. In addition, in the drain section A 610, the distance between the drain pad opening portions 611 is 1000 μm, and, in the drain section B 613, the distance between the drain pad opening portions 614 is 1500 μm.

Tenth Embodiment

Figure 12:
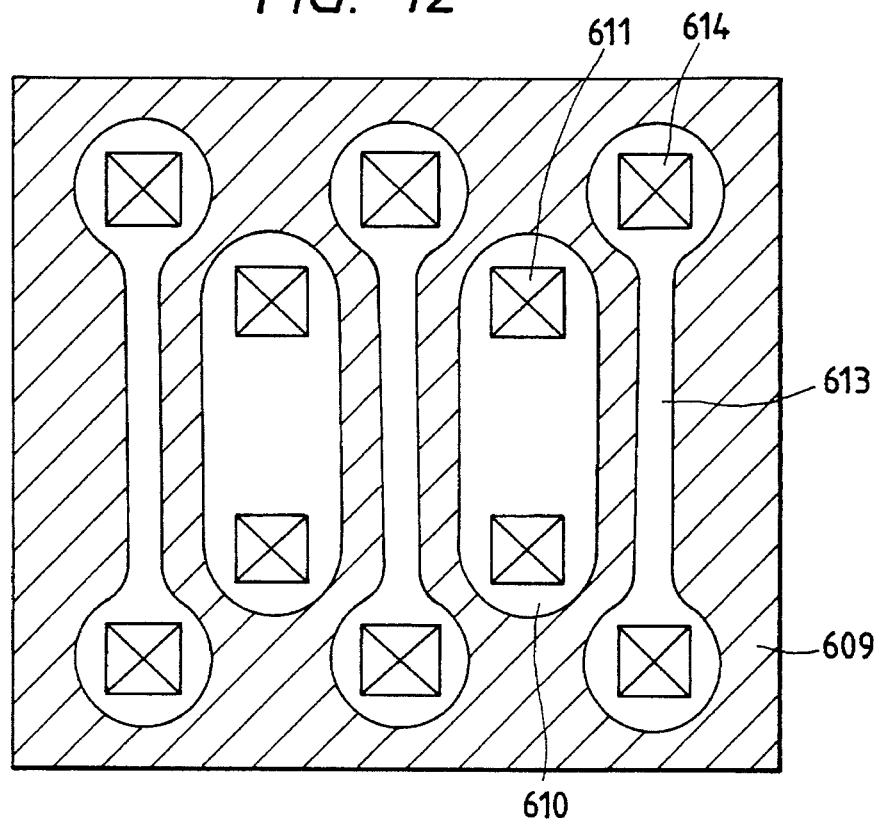
FIG. 12 is a plan view illustrating a configuration of a high voltage MOSFET in accordance with a tenth embodiment of the present invention.

FIG. 12 is a plan view illustrating a configuration of a high voltage MOSFET in accordance with a tenth embodiment of the present invention. It should be noted that, in FIG. 12, portions common to those of the high voltage MOSFET in accordance with the ninth embodiment shown in FIG. 10 are denoted by the same reference numerals, and description thereof will be omitted. In addition, in the high voltage MOSFET in accordance with this embodiment, its cross-sectional structure is substantially identical to the cross-sectional structure shown in FIG. 10(*b*).

In the high voltage MOSFET in accordance with this embodiment, the degree of integration of the device can be improved substantially by alternately disposing a plurality of the drain sections A 610 and the drain sections B 613. The drain section A 610 and the drain section B 613 shown in FIG. 12 are of the same size as the drain section A 610 and the drain section B 613 shown in FIG. 10(*a*). However, by alternately disposing two drain sections A 610 and three drain sections B 613 in the device having a size of 1.4×1.5 mm, the channel width can be increased by 25% as compared with the conventional high voltage MOSFET shown in FIG. 17. Accordingly, it is possible to increase the degree of integration and the low on-resistance can be promoted while maintaining a high withstand voltage.

Figure 13:
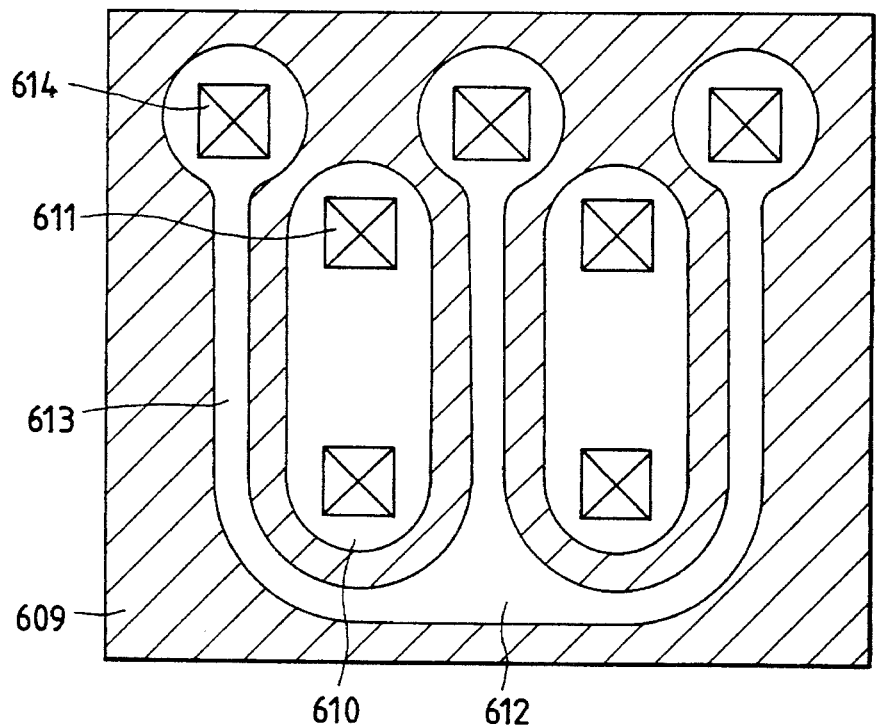
FIG. 13 is a plan view illustrating a configuration of a high voltage MOSFET as a modification of the tenth embodiment of the present invention.
Figure 17:
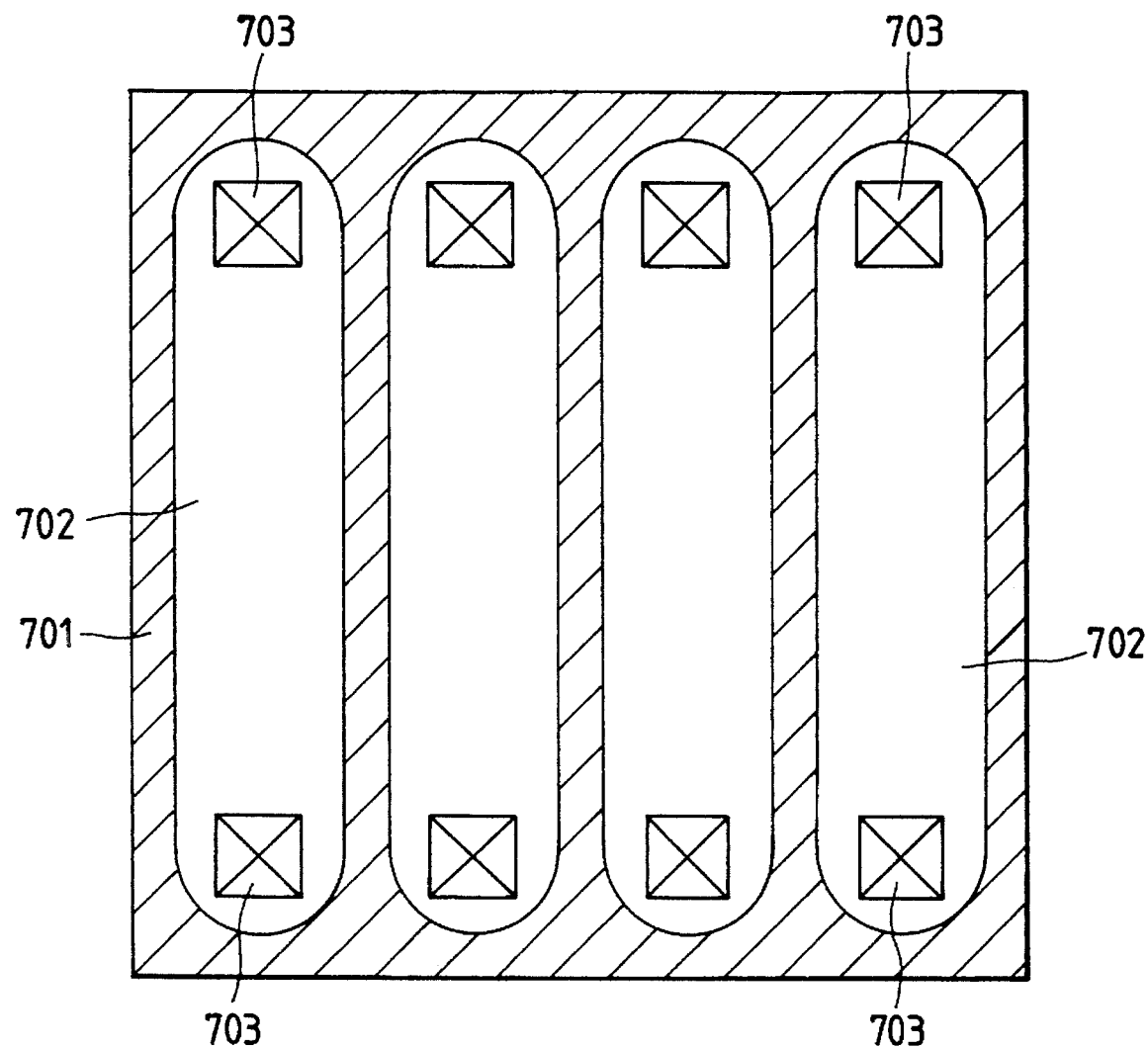
FIG. 17 is a plan view illustrating a configuration of a conventional high voltage MOSFET.

In addition, FIG. 13 is a modification of the high voltage MOSFET in accordance with the above-described tenth embodiment, which is a high voltage MOSFET in which the drain pad opening portion 614 is not formed on the lower side of the drain section B 613, but three drain sections B 613 are connected at their lower ends. The radius of curvature of a connecting portion 612 connecting the drain sections B 613 is 378 μm, which is sufficiently large so that the concentration of the electric field does not occur at this portion. Accordingly, in the same way as the high voltage MOSFET shown in FIG. 12, it is possible to reduce the on-resistance due to high integration while maintaining a high withstand voltage. In addition, in the high voltage MOSFET shown in FIG. 13, it is not necessary to enlarge a lower side end of the drain section B 613 on the basis of the radius of curvature at which a targeted withstand voltage is securable, and wiring is facilitated. It should be noted that the device size of the high voltage MOSFET shown in FIG. 13 is 1.4×1.5 mm similar to the high voltage MOSFET shown in FIG. 12, and an increased portion of the channel width as compared with the conventional device shown in FIG. 17 is 13%.

Eleventh Embodiment

Figure 14:
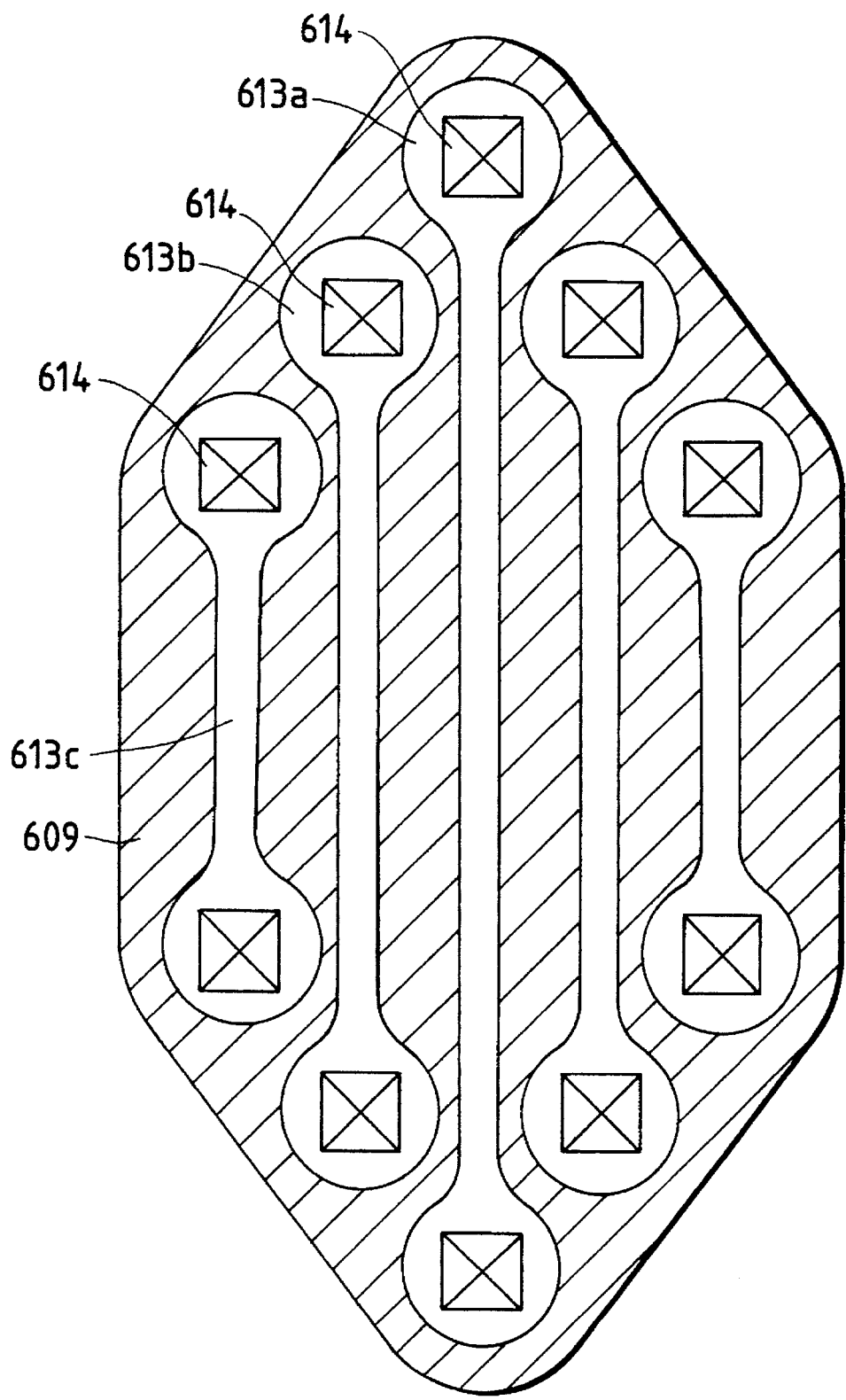
FIG. 14 is a plan view illustrating a configuration of a high voltage MOSFET in accordance with an eleventh embodiment of the present invention.

FIG. 14 is plan view illustrating a configuration of a high voltage MOSFET in accordance with a eleventh embodiment of the present invention. It should be noted that, in the high voltage MOSFET shown in FIG. 14, portions common to those of the high voltage MOSFET in accordance with the ninth embodiment shown in FIG. 10 are denoted by the same reference numerals, and description thereof will be omitted. A point to be noted in the high voltage MOSFET in accordance with this embodiment is that only the drain sections B in which the distance between the drain pad opening portions differs are juxtaposed in five rows. That is, a drain section B 613a, whose distance between the drain pad opening portions is approximately 2000 μm, is formed in a central portion of the device, and drain sections B 613b whose distance between the drain pad opening portions is approximately 1750 μm, are formed on both sides of the drain section B 613a. Furthermore, a drain section B 613c, whose distance between the drain pad opening portions is approximately 1500 μm, is formed along a side of the drain section B 613b which is away from the drain section B 613a.

In the high voltage MOSFET having the above-described configuration, since the inter-drain pitch between the drain pad opening portions in the adjacent drain sections can be reduced while securing a targeted withstand resistance to a degree that the targeted withstand resistance can be maintained, it is possible to reduce the on-resistance due to high integration while maintaining a high withstand voltage. Furthermore, in the high voltage MOSFET in accordance with this embodiment, the drain section B 613a, whose distance between the drain pad opening portions is the longest, is formed in the center, and the drain section B 613b and the drain section B 613c are formed along each side of this drain section B 613a in such a manner that the distance between the drain pad opening portions becomes consecutively smaller. For this reason, as is apparent from the planar structure shown in FIG. 14, the size of the region of the MIS section 609 remaining on the side end of each of the drain sections B 613a to 613c can be set substantially equal. Also, since a dead space in the MIS section 609 can be reduced, the device can operate effectively.

Figure 15:
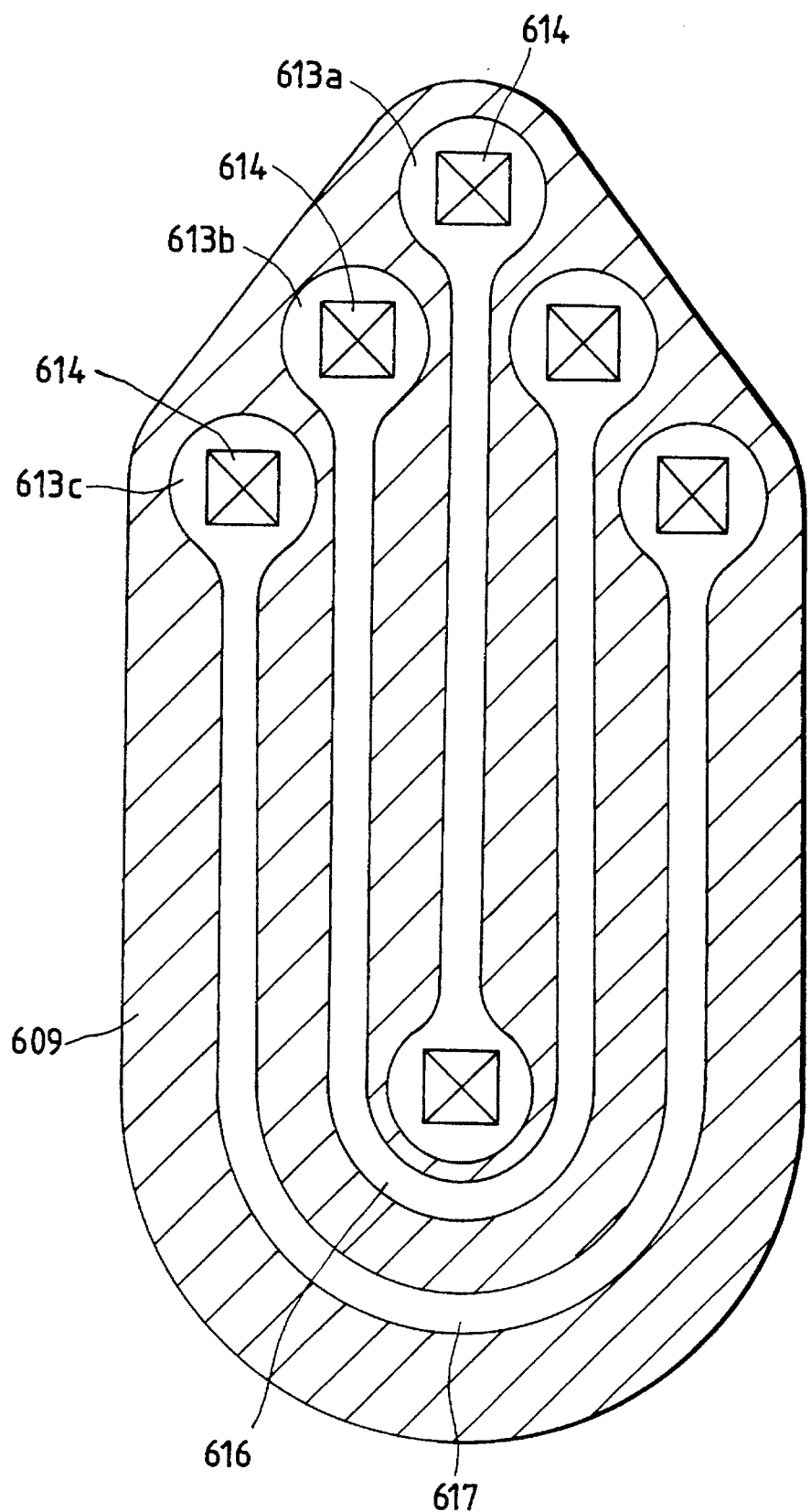
FIG. 15 is a plan view illustrating a configuration of a high voltage MOSFET as a modification of the eleventh embodiment of the present invention.

In addition, as a modification of the high voltage MOSFET in accordance with the eleventh embodiment shown in FIG. 14, a high voltage MOSFET having a planar structure shown in FIG. 15 is conceivable. This high voltage MOSFET is arranged such that, in the high voltage MOSFET shown in FIG. 14, the drain sections B 613b formed in two rows are connected to each other on the lower side, and the drain sections B 613c are also formed in a similar manner. The radius of curvature of a connecting portion 616 connecting the drain sections B 613b and the radius of curvature of a connecting portion 617 connecting the drain sections B 613c are respectively set to be sufficiently large, so that the electric field does not concentrate at these portions, making it possible to maintain a targeted withstand voltage. Accordingly, with this high voltage MOSFET, it is also possible to effect high integration and low on-resistance while maintaining a high withstand voltage.

Twelfth Embodiment

Figure 16:
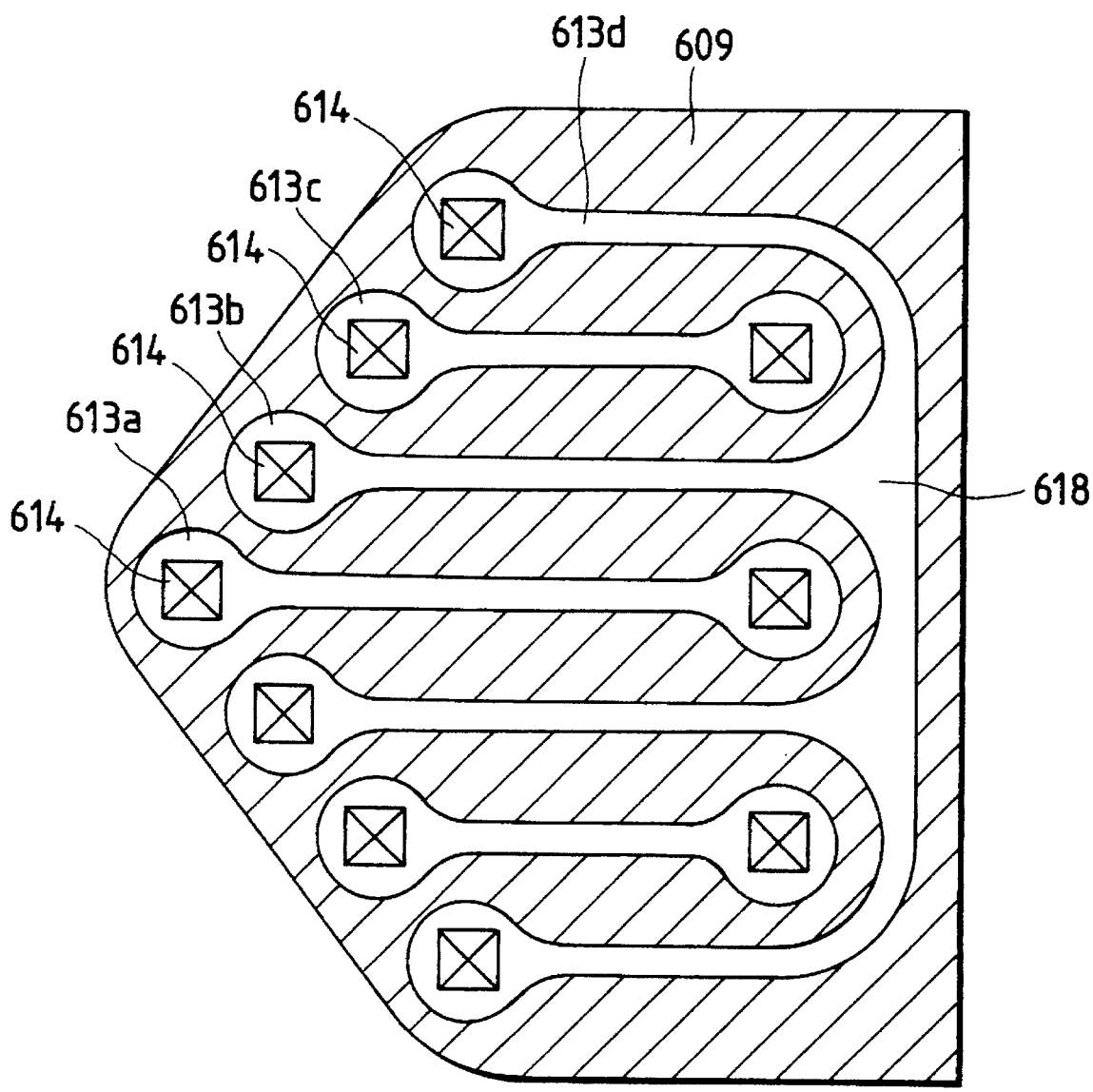
FIG. 16 is a plan view illustrating a configuration of a high voltage MOSFET in accordance with a twelfth embodiment of the present invention.

FIG. 16 is plan view illustrating a configuration of a high voltage MOSFET in accordance with a twelfth embodiment of the present invention. It should be noted that, in the high voltage MOSFET shown in FIG. 16, portions common to those of the high voltage MOSFET in accordance with the ninth embodiment shown in FIG. 10 are denoted by the same reference numerals, and description thereof will be omitted.

The high voltage MOSFET in accordance with this embodiment is arranged such that, in the planar structure of the high-voltage MOSFET in accordance with the eleventh embodiment shown in FIG. 14, drain sections B 613d are further formed along the sides of the drain sections B 613c, respectively, thereby juxtaposing the drain sections B in seven rows. Of these drain sections B 613a to 613d, the drain sections B 613b and the drain sections B 613d are connected at their lower ends.

In the high voltage MOSFET having the above-described configuration, since the radius of curvature of a connecting portion 618 connecting the drain sections B 613b and the drain sections B 613d is set to be sufficiently large, the concentration of the electric field does not occur at this portion and the withstand voltage does not deteriorate. Thus, in the high voltage MOSFET in accordance with this embodiment, since it is possible to reduce the inter-drain pitch and increase the degree of integration of the element without deteriorating the withstand voltage in the same way as the high voltage MOSFETs in accordance with the ninth to eleventh embodiments described above, low on-resistance due to high integration is attained while maintaining a high withstand voltage. Accordingly, even though its device size is small, it is possible to structure a high current-capacity, high voltage withstanding device, making it possible to provide a compact and high-performance power IC.

As described above, the high voltage MIS field effect transistor in accordance with the present invention is characterized in that a low-concentration region of a first conductivity type is provided in a vicinity of a periphery of a base corner portion which exhibits a protruding shape in a plan view. Also, a low-concentration region of a second conductivity type is provided in a vicinity of a periphery of a drain corner portion which exhibits a protruding shape in a plan view. As a result, the following advantages are obtained.

Since the low-concentration region in the vicinity of the periphery of the base corner portion and the low-concentration region in the vicinity of the periphery of the drain corner portion are depleted by an applied voltage which is lower than a critical voltage, the field strength applied to the base corner portion and the drain corner portion does not increase more than that voltage. Hence, the base corner portion and the drain corner portion where the electric field concentrates as a result of the formation of an element into a finer pattern can be provided with a high-voltage withstanding structure, thereby making it possible to maintain a targeted withstand voltage. Accordingly, since the on-resistance can be reduced by increasing the degree of integration without deteriorating the withstand voltage, it becomes possible to attain the compatibility of both the high withstand voltage and an output of a high current due to low-on resistance. Here, in a case where the drain section has its periphery surrounded by the gate electrode and the source electrode, and the low-concentration semiconductor region of the first conductivity type and the low-concentration semiconductor region of the second conductivity type are formed for all the base corner portions and the drain corner portions, it is possible to alleviate the concentration of the electric field at a side end of an output terminal region where the withstand voltage has possibly been rate-determined in a conventional high voltage element. Hence, it becomes unnecessary to take a measure to alleviate the concentration of the electric field, and the element design is facilitated.

In addition, the present invention is characterized in that the drain pad opening portion in the first parallel region is formed by being offset outwardly in the lengthwise direction in parallel with respect to the drain pad opening portion in the second parallel region adjacent to the first parallel region. Also, the width of a portion where the drain pad opening portion is not formed in the first parallel region is set to be smaller than the width of the drain pad opening portion. As a result, it becomes possible to reduce the distance between adjacent parallel regions while substantially securing a distance between drain pad opening portions in the adjacent first and second parallel regions, which is considered necessary for securing a targeted withstand voltage. In addition, since it is possible to secure the MIS section region provided between the parallel regions, the distance between which is reduced, it is possible to attain a low on-resistance due to high integration without deteriorating the withstand voltage.

Furthermore, in a case where the width of a portion where the drain pad opening portion is not formed in the second parallel region is set to be smaller than the width of the drain pad opening portion, it is possible to increase the channel width to further reduce the low on-resistance.

What is claimed is:

1. A high voltage metal insulator semiconductor (MIS) field effect transistor, comprising:
   a semiconductor substrate of a first conductivity type having a side surface;
   a semiconductor layer of a second conductivity type formed on the side surface of said semiconductor substrate;
   a base layer of the first conductivity type formed in said semiconductor layer, said base layers having a base corner portion;
   a source layer of the second conductivity type formed in said base layer;
   a source electrode abutting said source layer;
   a gate electrode extending from said source layer to said semiconductor layer via an insulating gate film;
   a drain section including a drain layer of the second conductivity type formed in said semiconductor layer, the drain layer being spaced apart from said source layer; and
   a low-concentration region of the first conductivity type formed adjacent to the base corner portion of said base layer, said base corner portion exhibiting a protruding shape in a plan view.

2. A high voltage MIS field effect transistor according to claim 1, further comprising an offset layer of the first conductivity type extending between said base layer and said drain layer.

3. A high voltage MIS field effect transistor according to claim 1 or 2, wherein said low-concentration region of the first conductivity type is a partial region of said semiconductor substrate selectively left intact as a region where said semiconductor layer is not formed.

4. A high voltage MIS field effect transistor according to claim 1 or 2, wherein said low-concentration region of the first conductivity type is a diffused layer formed from the side surface of said semiconductor layer to said semiconductor substrate.

5. A high voltage MIS field effect transistor according to claim 1 or 2, wherein said semiconductor layer of the second conductivity type includes a side end terminating at a bottom of said base layer.

6. A high voltage MIS field effect transistor according to claim 1 or 2, wherein said semiconductor layer of the second conductivity type includes a side end terminating below a lower side of said gate electrode.

7. A high voltage MIS field effect transistor according to claim 1 or 2, wherein said semiconductor layer of the second conductivity type includes a side end surrounding said base layer.

8. A high voltage metal insulator semiconductor (MIS) field effect transistor, comprising:
   a semiconductor substrate of a first conductivity type having a side surface;
   a semiconductor layer of a second conductivity type formed on the side surface of said semiconductor substrate;
   a base layer of the first conductivity type formed in said semiconductor layer;
   a source layer of the second conductivity type formed in said base layer;
   a source electrode abutting said source layer;
   a gate electrode extending from said source layer to said semiconductor layer via an insulating gate film;
   a drain section including a drain layer of the second conductivity type formed in said semiconductor layer and having a drain corner portion, the drain layer spaced apart from said source layer;
   an offset layer of the first conductivity type formed on the side surface of said semiconductor layer; and
   a low-concentration region of the second conductivity type formed adjacent to the drain corner portion of said drain layer, said drain corner portion exhibiting a protruding shape in a plan view.

9. A high voltage MIS field effect transistor according to claim 8, wherein said low-concentration region of the second conductivity type is a partial region of said semiconductor layer of the second conductivity type selectively left intact as a region where said offset layer is not formed.

10. A high voltage MIS field effect transistor according to claim 8, wherein a side end of said semiconductor layer of the second conductivity type surrounds said base layer.

11. A high voltage MIS field effect transistor according to claim 8, wherein said semiconductor layer of the second conductivity type includes a side end terminating at a bottom of said base layer.

12. A high voltage MIS field effect transistor according to claim 8, wherein said semiconductor layer of the second conductivity type includes a side end terminating at a bottom of said offset layer.

13. A high voltage MIS field effect transistor according to claim 8, further comprising a low-concentration region of the first conductivity type formed adjacent to a base corner portion of said base layer, said base corner portion exhibiting a protruding shape in a plan view.

14. A high voltage MIS field effect transistor according to claim 13, wherein said drain section has a periphery surrounded by said gate electrode and said source electrode, and said low-concentration semiconductor region of the first conductivity type and said low-concentration semiconductor region of the second conductivity type are formed in all of said base corner portion and said drain corner portion.

15. A high voltage MIS field effect transistor according to claim 14, further comprising a plurality of high voltage MIS field effect transistors incorporated in a chip.

16. A high voltage metal insulator semiconductor (MIS) field effect transistor, comprising:
   a semiconductor substrate of a first conductivity type having a side surface;
   a semiconductor layer of a second conductivity type formed on the side surface of said semiconductor substrate;
   a base layer of the first conductivity type formed in said semiconductor layer;
   a source layer of the second conductivity type formed in said base layer;
   a source electrode abutting said source layer;
   a gate electrode extending from said source layer to said semiconductor layer via an insulating gate film;

a drain section including a drain layer of the second conductivity type formed in said semiconductor layer, said drain section including a plurality of parallel regions and having a periphery surrounded by said gate electrode and said source electrode;

a first drain pad portion having a first opening in a first parallel region of said plurality of parallel regions; and a second drain pad portion having a second opening in a second parallel region of said plurality of parallel regions adjacent to said first parallel region;

wherein said first drain pad portion is offset outwardly in a lengthwise direction of said corresponding parallel regions with respect to said second drain pad portion, and a width of a portion of said first parallel region where said first drain pad portion is not formed is set to be smaller than a width of said first parallel region where said first drain pad portion is formed.

17. A high voltage MIS field effect transistor according to claim 16, wherein a width of a portion of said second parallel region where said second drain pad portion is not formed is set to be smaller than a width of said second parallel region where said second drain pad portion is formed.

18. A high voltage MIS field effect transistor according to claim 16, wherein a radius of curvature of one of said first and second drain pad opening portion has a withstand-voltage-securing length to secure a predetermined withstand voltage.

19. A high voltage MIS field effect transistor according to claim 16, wherein two or more of said plurality of parallel regions are connected.

20. A high voltage MIS field effect transistor according to claim 1, 8 or 16, wherein said source electrode is a field plate-type source electrode extending from an end of said source layer toward said drain layer.

21. A high voltage MIS field effect transistor according to claim 1, 8 or 16, further comprising a drain electrode abutting said drain layer, said drain electrode being a field plate-type drain electrode extending from an end of said drain layer toward said source layer.

* * * * *